United States Patent
Ulupinar et al.

(10) Patent No.: US 9,160,566 B2
(45) Date of Patent: Oct. 13, 2015

(54) QOS MAPPING FOR RELAY NODES

(75) Inventors: Fatih Ulupinar, San Diego, CA (US); Yongsheng Shi, Falls Church, VA (US); Gavin Bernard Horn, La Jolla, CA (US); Parag Arun Agashe, San Diego, CA (US); Xiaolong Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1068 days.

(21) Appl. No.: 12/756,281

(22) Filed: Apr. 8, 2010

(65) Prior Publication Data

US 2010/0260129 A1 Oct. 14, 2010

Related U.S. Application Data

(60) Provisional application No. 61/168,522, filed on Apr. 10, 2009.

(51) Int. Cl.
*H04L 12/28* (2006.01)
*H04L 12/56* (2006.01)
*H04L 12/46* (2006.01)
(Continued)

(52) U.S. Cl.
CPC .......... *H04L 12/4633* (2013.01); *H04L 69/04* (2013.01); *H04L 69/22* (2013.01); *H04W 28/06* (2013.01); *H01L 2924/00013* (2013.01); *H04W 40/22* (2013.01); *H04W 40/32* (2013.01); *H04W 80/04* (2013.01); *H04W 88/04* (2013.01)

(58) Field of Classification Search
CPC ...... H04W 88/08; H04W 72/04; H04W 76/00
USPC ................ 370/329, 328, 330, 341, 338, 331, 370/389–392; 455/445, 456.2; 709/224
See application file for complete search history.

(56) References Cited

U.S. PATENT DOCUMENTS

| 6,839,339 B1 | 1/2005 | Chuah | |
| 7,606,238 B2 * | 10/2009 | Kawakami | 370/395.5 |

(Continued)

FOREIGN PATENT DOCUMENTS

| CN | 1790479 A | 6/2006 |
| CN | 101262408 A | 9/2008 |

(Continued)

OTHER PUBLICATIONS

3rd Generation Partnership Project; Technical Specification Group Services and System Aspects; Policy and charging control architecture (Release 9), 3GPP Standard; 3GPP TS 23.203, 3rd Generation Partnership Project (3GPP), Mobile Competence Centre ; 650, Route Des Lucioles ; F-06921 Sophia-Antipolis Cedex ; France, No. V9.0.0, Mar. 1, 2009, pp. 1-113, XP050363030, paragraph [6.2.2].

(Continued)

*Primary Examiner* — Chuong T Ho
(74) *Attorney, Agent, or Firm* — Michael J. DeHaemer, Jr.

(57) ABSTRACT

Systems and methodologies are described that facilitate packet routing among relay nodes in a wireless network. Bearer quality of service (QoS) mapping is provided for internet protocol (IP) relays by utilizing differentiated services (DiffServ) code point (DSCP) values to determine a bearer for communicating related packets. In addition, SDF filtering at a gateway node can be modified to route packets over certain tunnels to provide QoS for the packets.

64 Claims, 19 Drawing Sheets

(51) Int. Cl.
*H04W 28/06* (2009.01)
*H04L 29/06* (2006.01)
*H04W 40/22* (2009.01)
*H04W 40/32* (2009.01)
*H04W 80/04* (2009.01)
*H04W 88/04* (2009.01)

(56) References Cited

U.S. PATENT DOCUMENTS

| | | | |
|---|---|---|---|
| 7,889,650 B2 * | 2/2011 | Duan | 370/230 |
| 8,064,395 B2 * | 11/2011 | Gasparroni et al. | 370/329 |
| 8,144,591 B2 * | 3/2012 | Ghai et al. | 370/235 |
| 8,155,020 B2 * | 4/2012 | Giaretta et al. | 370/252 |
| 8,179,903 B2 * | 5/2012 | Gupta et al. | 370/400 |
| 8,218,436 B2 * | 7/2012 | Zhao et al. | 370/230 |
| 8,295,174 B2 * | 10/2012 | Wu et al. | 370/233 |
| 8,332,926 B2 | 12/2012 | Babbar et al. | |
| 8,437,358 B2 * | 5/2013 | Shin et al. | 370/415 |
| 8,514,756 B1 * | 8/2013 | Ramachandra et al. | 370/310 |
| 8,605,585 B2 * | 12/2013 | Duan | 370/230 |
| 8,831,014 B2 * | 9/2014 | Koodli et al. | 370/401 |
| 2002/0057657 A1 | 5/2002 | La Porta et al. | |
| 2005/0237955 A1 | 10/2005 | Shapira et al. | |
| 2006/0123980 A1 | 6/2006 | Nakazono | |
| 2007/0109966 A1 * | 5/2007 | Lee et al. | 370/231 |
| 2007/0147366 A1 | 6/2007 | Babbar et al. | |
| 2007/0174436 A1 * | 7/2007 | Maekawa et al. | 709/223 |
| 2007/0189297 A1 * | 8/2007 | Duan | 370/394 |
| 2007/0286136 A1 | 12/2007 | Rittle et al. | |
| 2008/0049695 A1 * | 2/2008 | Ogura | 370/338 |
| 2008/0153454 A1 | 6/2008 | Haapapuro et al. | |
| 2008/0165776 A1 | 7/2008 | Tao et al. | |
| 2008/0219203 A1 | 9/2008 | Chou et al. | |
| 2008/0291868 A1 * | 11/2008 | Prakash et al. | 370/328 |
| 2008/0304485 A1 | 12/2008 | Sinha et al. | |
| 2009/0003298 A1 | 1/2009 | Chu et al. | |
| 2009/0016282 A1 * | 1/2009 | Gasparroni et al. | 370/329 |
| 2009/0016334 A1 * | 1/2009 | Forsberg et al. | 370/389 |
| 2009/0080422 A1 | 3/2009 | Lee et al. | |
| 2009/0111476 A1 * | 4/2009 | Hamalainen et al. | 455/450 |
| 2009/0129342 A1 * | 5/2009 | Hwang et al. | 370/331 |
| 2009/0175178 A1 | 7/2009 | Yoon et al. | |
| 2009/0182883 A1 * | 7/2009 | Giaretta et al. | 709/228 |
| 2009/0196225 A1 * | 8/2009 | Avila Gonzalez et al. | 370/328 |
| 2009/0232019 A1 * | 9/2009 | Gupta et al. | 370/252 |
| 2009/0238207 A1 * | 9/2009 | Zhao et al. | 370/468 |
| 2009/0245108 A1 * | 10/2009 | Wu et al. | 370/233 |
| 2009/0252132 A1 * | 10/2009 | Song et al. | 370/338 |
| 2010/0103863 A1 * | 4/2010 | Ulupinar et al. | 370/315 |
| 2010/0103865 A1 | 4/2010 | Ulupinar et al. | |
| 2010/0128722 A1 * | 5/2010 | Madour et al. | 370/352 |
| 2010/0235620 A1 * | 9/2010 | Nylander et al. | 713/151 |
| 2010/0240385 A1 * | 9/2010 | Lohr et al. | 455/452.2 |
| 2010/0254399 A1 * | 10/2010 | Shin et al. | 370/415 |
| 2010/0260098 A1 | 10/2010 | Ulupinar et al. | |
| 2010/0260109 A1 | 10/2010 | Ulupinar et al. | |
| 2010/0260129 A1 * | 10/2010 | Ulupinar et al. | 370/329 |
| 2010/0272006 A1 | 10/2010 | Bertrand et al. | |
| 2011/0075633 A1 | 3/2011 | Johansson et al. | |
| 2011/0075675 A1 * | 3/2011 | Koodli et al. | 370/401 |
| 2011/0096672 A1 * | 4/2011 | Mattisson et al. | 370/249 |
| 2011/0103261 A1 * | 5/2011 | Duan | 370/254 |
| 2011/0158166 A1 | 6/2011 | Lee et al. | |

FOREIGN PATENT DOCUMENTS

| | | |
|---|---|---|
| EP | 1122925 | 8/2001 |
| EP | 2282577 | 2/2011 |
| JP | 2004512743 A | 4/2004 |
| JP | 2004523947 A | 8/2004 |
| JP | 2004533792 A | 11/2004 |
| JP | 2008172759 A | 7/2008 |
| JP | 2008289126 A | 11/2008 |
| JP | 2009044737 A | 2/2009 |
| JP | 2009526424 A | 7/2009 |
| JP | 2009535980 A | 10/2009 |
| JP | 2009538011 A | 10/2009 |
| JP | 2009544227 A | 12/2009 |
| JP | 2010530681 A | 9/2010 |
| JP | 2012523144 A | 9/2012 |
| KR | 20090031187 A | 3/2009 |
| TW | 200833146 A | 8/2008 |
| WO | WO2006123980 | 11/2006 |
| WO | WO2007087828 A1 | 8/2007 |
| WO | WO2007130281 A2 | 11/2007 |
| WO | WO-2007133998 A2 | 11/2007 |
| WO | WO-2008011027 A2 | 1/2008 |
| WO | WO2009024508 | 2/2009 |
| WO | WO2009134178 | 11/2009 |
| WO | WO-2011020108 A2 | 2/2011 |

OTHER PUBLICATIONS

Christian Hoymann et al: "A self-backhauling solution for LTE-Advanced", Wireless World Research Forum, Meeting, XX, XX, [Online] No. 21TH, Oct. 13, 2008, pp. 1-5, XP002540105, Retrieved from the Internet: URL:http://www.wireless-world-research.org /fileadmin/sites/default/files/meetings/Past%20Meeti ngs/2008/WWRF21/Presentations%20and%20Papers/WG4/papers/WWRF21-WG4-07__Hoymann.pdf> [retrieved on Jul. 16, 2009] paragraph [0IV.]-paragraph [OV.a]; figure 7.

Ekstrom H: "QoS control in the 3GPPevolved packet system", IEEE Communications Magazine, IEEE Service Center, Piscataway, US LNKD, DOI : 10 . 1109/MCOM.2009.4785383, vol. 47, No. 2, Feb. 1, 2009, pp. 76-83, XP011280742, ISSN: 0163-6804 pp. 76-78 , pp. 80-81 , figures 2,3,5,6.

ETRI: "Considerations on relay architecture" 3GPP Draft; R2-092425 Considerations on Relay Architecture, 3rd Generation Partnership Project (3GPP), Mobile Competence Centre ; 650, Route Des Lucioles ; F-06921 Sophia-Antipolis Cedex ; France, No. Seoul, Korea; 20090317, Mar. 17, 2009, XP050340137.

International Search Report and Written Opinion—PCT/US2010/030761, International Search Authority—European Patent Office—Dec. 6, 2010.

RAN3 LTE-A Rapporteur: "LTE-A RAN3 Baseline Document" 3GPP Draft; R3-091447, 3rd Generation Partnership Project (3GPP), France, San Francisco, USA; May 9, 2009, XP050341769.

Bormann C., et al., "Robust Header Compression (RoHC); Framework and four profiles: RTP, UDP, ESP and uncompressed" Internet Engineering Task Force, (RFC) 3095, Jul. 2001, pp. 1-168.

Buford J, et al., "Sleeper: A Power-Conserving Service Discovery Protocol" Mobile and Ubiquitous Systems: Networking & Services, 2006 Third a Nnual International Conference on, IEEE, PI, Jul. 1, 2006, pp. 1-10, XP031068689 ISBN: 978-1-4244-0498-8 abstract p. 6, left-hand column, lines 10-31.

Taiwan Search Report—TW099111107—TIPO—Jan. 17, 2014.

Huawei, "3GPP TSG-RAN WG3#63bis R3-090809, LTE-A Type 1 relay architecture [online],"pp. 1-5, <URL:http://www.3gpp.org/ftp/tsg_ran/WG3_lu/TSGR3_63bis/Docs/R3-090809.zip>, Mar. 26, 2009.

Qualcomm Europe: "Preference for Relay Operation in LTE-A", R3-090702, 3GPP TSG-RAN WG3 #63bis, Mar. 27, 2009.

\* cited by examiner

QOS MAPPING FOR RELAY NODES

CLAIM OF PRIORITY UNDER 35 U.S.C. §119

The present Application for patent claims priority to Provisional Application No. 61/168,522 entitled "RELAY NODE PROCESSING FOR LONG TERM EVOLUTION SYSTEMS" filed Apr. 10, 2009, and assigned to the assignee hereof and hereby expressly incorporated by reference herein.

BACKGROUND

1. Field

The following description relates generally to wireless communications, and more particularly to routing data packets among multiple access points.

2. Background

Wireless communication systems are widely deployed to provide various types of communication content such as, for example, voice, data, and so on. Typical wireless communication systems may be multiple-access systems capable of supporting communication with multiple users by sharing available system resources (e.g., bandwidth, transmit power, . . . ). Examples of such multiple-access systems may include code division multiple access (CDMA) systems, time division multiple access (TDMA) systems, frequency division multiple access (FDMA) systems, orthogonal frequency division multiple access (OFDMA) systems, and the like. Additionally, the systems can conform to specifications such as third generation partnership project (3GPP), 3GPP long term evolution (LTE), ultra mobile broadband (UMB), and/or multi-carrier wireless specifications such as evolution data optimized (EV-DO), one or more revisions thereof, etc.

Generally, wireless multiple-access communication systems may simultaneously support communication for multiple mobile devices. Each mobile device may communicate with one or more access points (e.g., base stations) via transmissions on forward and reverse links. The forward link (or downlink) refers to the communication link from access points to mobile devices, and the reverse link (or uplink) refers to the communication link from mobile devices to access points. Further, communications between mobile devices and access points may be established via single-input single-output (SISO) systems, multiple-input single-output (MISO) systems, multiple-input multiple-output (MIMO) systems, and so forth. Access points, however, can be limited in geographic coverage area as well as resources such that mobile devices near edges of coverage and/or devices in areas of high traffic can experience degraded quality of communications from an access point.

Relay nodes can be provided to expand network capacity and coverage area by facilitating communication between mobile devices and access points. For example, a relay node can establish a backhaul link with a donor access point, which can provide access to a number of relay nodes, and the relay node can establish an access link with one or more mobile devices or additional relay nodes. To mitigate modification to backend core network components, communication interfaces with the backend network components, such as S1-U, can terminate at the donor access point. Thus, the donor access point appears as a normal access point to backend network components. To this end, the donor access point can route packets from the backend network components to the relay nodes for communicating to the mobile devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and corresponding disclosure thereof, various aspects are described in connection with facilitating routing data from a donor access point among one or more relay nodes to one or more end devices and/or vice versa. For example, the one or more relay nodes can communicate with the donor access points similar to user equipment (UE) or other end devices, and thus are limited to a number of radio bearers that can be established with the donor access point. The one or more relay nodes, however, can also support establishing another number of radio bearers with a given UE. Thus, for example, bearer mapping and/or tunnel associating procedures can be defined at the relay node and/or within the core network to ensure proper delivery of packets over radio bearers established between the one or more relay nodes and the donor access point, as well as subsequently over one or more radio bearers established between the one or more relay nodes and the given UE. In one example, core network components related to a UE can communicate packets to core network components related to a serving relay node specifying one or more parameters related to a tunnel or corresponding bearer in an application layer header, such as an internet protocol (IP) header. The one or more parameters can be utilized to route the packets over an appropriate bearer established between the relay node and donor access point. In another example, service data flow (SDF) filters can be utilized or modified to effectuate such routing based on the one or more parameters.

According to related aspects, a method is provided that includes establishing a plurality of communication tunnels with a donor evolved Node B (eNB), each related to one of a plurality of radio bearers between the donor eNB and a relay eNB and receiving a packet related to a wireless device including a plurality of protocol headers. The method further includes selecting a tunnel from the plurality of communication tunnels for transmitting the packet to the donor eNB based at least in part on one or more parameters of at least one of the plurality of protocol headers.

Another aspect relates to an apparatus. The apparatus can include at least one processor configured to establish a plurality of communication tunnels with a donor eNB related to a plurality of radio bearers between the donor eNB and a relay eNB and obtain a packet from an upstream gateway comprising a plurality of protocol headers. The at least one processor is further configured to select one of the plurality of communication tunnels to receive the packet based at least in part on one or more parameters in at least one of the plurality of protocol headers. The apparatus also comprises a memory coupled to the at least one processor.

Yet another aspect relates to an apparatus. The apparatus includes means for initializing a plurality of communication tunnels with a donor eNB related to a plurality of radio bearers established between the donor eNB and a relay eNB and means for receiving a packet related to a wireless device comprising a plurality of protocol headers. The apparatus also includes means for determining a tunnel from the plurality of communication tunnels for transmitting the packet to the donor eNB based at least in part on one or more parameters of at least one of the plurality of protocol headers.

Still another aspect relates to a computer program product, which can have a computer-readable medium including code for causing at least one computer to establish a plurality of communication tunnels with a donor eNB related to a plurality of radio bearers between the donor eNB and a relay eNB and code for causing the at least one computer to obtain a packet from an upstream gateway comprising a plurality of protocol headers. The computer-readable medium can also comprise code for causing the at least one computer to select one of the plurality of communication tunnels to receive the packet based at least in part on one or more parameters in at least one of the plurality of protocol headers.

Moreover, an additional aspect relates to an apparatus including a tunnel initializing component that establishes a plurality of communication tunnels with a donor eNB related to a plurality of radio bearers established between the donor eNB and a relay eNB and a communicating component that receives a packet related to a wireless device comprising a plurality of protocol headers. The apparatus can further include a tunnel associating component that determines a tunnel from the plurality of communication tunnels for transmitting the packet to the donor eNB based at least in part on one or more parameters of at least one of the plurality of protocol headers.

According to another aspect, a method is provided that includes receiving one or more SDF filter parameters from a core wireless network component and obtaining an uplink packet from a wireless device over one of a plurality of radio bearers associated therewith. The method further includes selecting one of a plurality of disparate radio bearers established with an upstream eNB for transmitting the uplink packet based at least in part on the one or more SDF filter parameters.

Another aspect relates to a wireless communications apparatus. The wireless communications apparatus can include at least one processor configured to obtain one or more SDF filter parameters from an upstream network component and receive an uplink packet from a wireless device over a radio bearer established with the wireless device. The at least one processor is further configured to determine a disparate radio bearer established with an upstream eNB for transmitting the uplink packet based at least in part on the one or more SDF filter parameters. The wireless communications apparatus also comprises a memory coupled to the at least one processor.

Yet another aspect relates to an apparatus. The apparatus includes means for receiving one or more SDF filter parameters and means for receiving an uplink packet from a wireless device. The apparatus also includes means for determining a radio bearer established with an upstream eNB for transmitting the uplink packet based at least in part on the one or more SDF filter parameters.

Still another aspect relates to a computer program product, which can have a computer-readable medium including code for causing at least one computer to obtain one or more SDF filter parameters from an upstream network component and code for causing the at least one computer to receive an uplink packet from a wireless device over a radio bearer established with the wireless device. The computer-readable medium can also comprise code for causing the at least one computer to determine a disparate radio bearer established with an upstream eNB for transmitting the uplink packet based at least in part on the one or more SDF filter parameters.

Moreover, an additional aspect relates to an apparatus including a SDF filter parameter receiving component that obtains one or more SDF filter parameters from a network component and a communicating component that receives an uplink packet from a wireless device. The apparatus can further include an SDF filtering component that determines a radio bearer established with an upstream eNB for transmitting the uplink packet based at least in part on the one or more SDF filter parameters.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed and this description is intended to include all such aspects and their equivalents.

DETAILED DESCRIPTION

Figure 1:
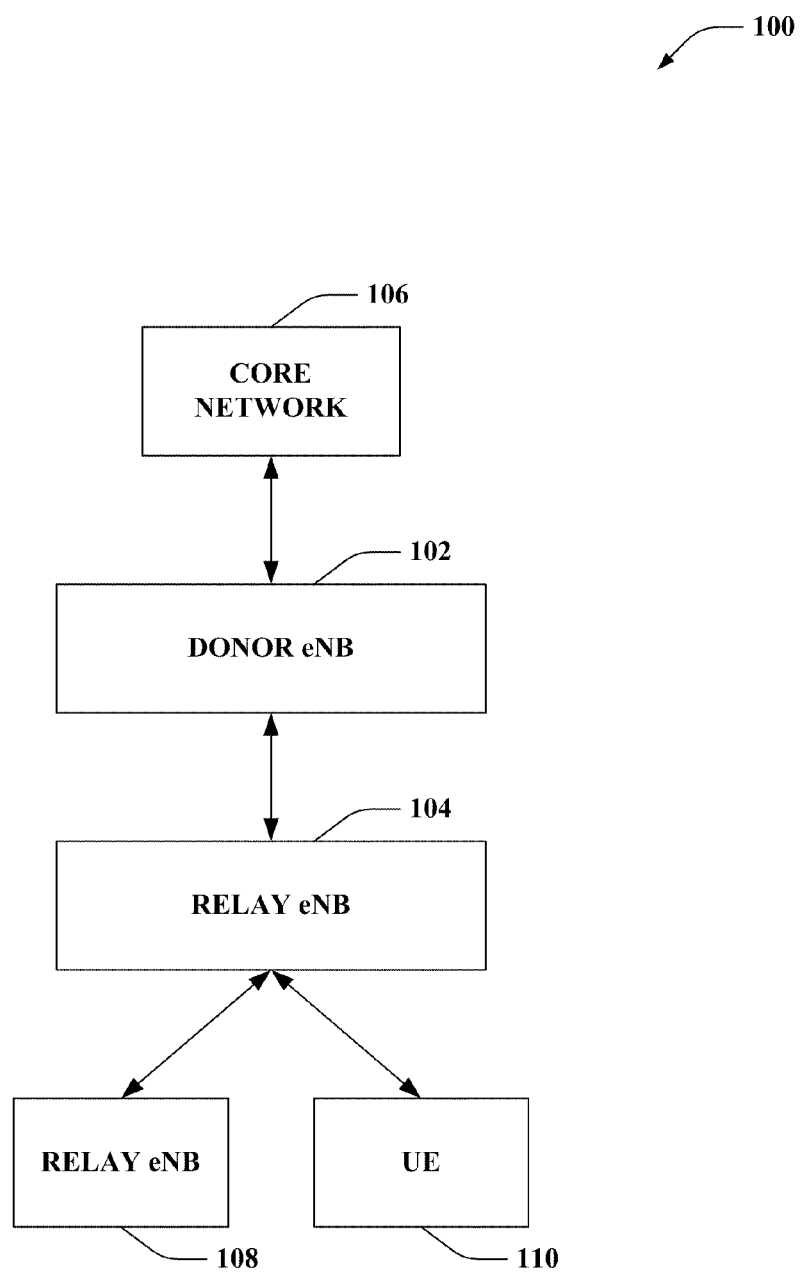
FIG. 1 is an illustration of an example wireless communications system that facilitates providing relays for wireless networks.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal. A terminal can also be called a system, device, subscriber unit, subscriber station, mobile station, mobile, mobile device, remote station, remote terminal, access terminal, user terminal, terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, evolved Node B (eNB), or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Referring to FIG. 1, a wireless communication system 100 is illustrated that facilitates providing relay functionality in wireless networks. System 100 includes a donor eNB 102 that provides one or more relay eNBs, such as relay eNB 104, with access to a core network 106. Similarly, relay eNB 104 can provide one or more disparate relay eNBs, such as relay eNB 108, or UEs, such as UE 110, with access to the core network 106 via donor eNB 102. Donor eNB 102, which can also be referred to as a cluster eNB, can communicate with the core network 106 over a wired or wireless backhaul link, which can be an LTE or other technology backhaul link. In one example, the core network 106 can be a 3GPP LTE or similar technology network.

Donor eNB 102 can additionally provide an access link for relay eNB 104, which can also be wired or wireless, LTE or other technologies, and the relay eNB 104 can communicate with the donor eNB 102 using a backhaul link over the access link of the donor eNB 102. Relay eNB 104 can similarly provide an access link for relay eNB 108 and/or UE 110, which can be a wired or wireless LTE or other technology link. In one example, donor eNB 102 can provide an LTE access link, to which relay eNB 104 can connect using an LTE backhaul, and relay eNB 104 can provide an LTE access link to relay eNB 108 and/or UE 110. Donor eNB 102 can connect to the core network 106 over a disparate backhaul link technology. Relay eNB 108 and/or UE 110 can connect to the relay eNB 104 using the LTE access link to receive access to core network 106, as described. A donor eNB and connected relay eNBs can be collectively referred to herein as a cluster.

According to an example, relay eNB 104 can connect to a donor eNB 102 at the link layer (e.g., media access control (MAC) layer), transport layer, application layer, and/or the like, as would a UE in conventional LTE configurations. In this regard, donor eNB 102 can act as a conventional LTE eNB requiring no changes at the link layer, transport layer, application layer, etc, or related interface (e.g., user-to-user (Uu), such as E-UTRA-Uu, user-to-network (Un), such as EUTRA-Un, etc.), to support the relay eNB 104. In addition, relay eNB 104 can appear to UE 110 as a conventional eNB in LTE configurations at the link layer, transport layer, application layer, and/or the like, such that no changes are required for UE 110 to connect to relay eNB 104 at the link layer, transport layer, application layer, etc., for example. In addition, relay eNB 104 can configure procedures for resource partitioning between access and backhaul link, interference management, idle mode cell selection for a cluster, and/or the like. It is to be appreciated that relay eNB 104 can connect to additional donor eNBs, in one example.

Thus, for example, relay eNB 104 can establish a connection with donor eNB 102 to receive access to one or more components in core network 106 (such as a mobility management entity (MME), serving gateway (SGW), packet data network (PDN) gateway (PGW), etc.). In an example, relay eNB 104 can obtain an internet protocol (IP) address from a PGW/SGW in the core network 106 (e.g., via donor eNB 102) for communicating therewith. In addition, UE 110 can establish a connection with relay eNB 104 to receive access to one or more similar components in core network 106. In this regard, for example, UE 110 can communicate IP packets to relay eNB 104 for providing to core network 106. Relay eNB 104 can obtain the IP packets, associate an additional IP header with the packets related to relay eNB 104, and provide the packets to donor eNB 102. Thus, donor eNB 102 can route the packets to a component of core network 106 related to relay eNB 104 (e.g., by adding another header and transmitting to core network 106).

Components of core network 106, for example, can route the packets within the core network 106 according to the various IP headers. Moreover, for example, core network 106 can construct packets for providing to UE 110 to include IP headers related to routing the packet to UE 110 through relay eNB 104. In an example, core network 106 can include an IP header related to UE 110 with the packet, as well as an IP header related to relay eNB 104, and one related to donor eNB 102. Core network 106 can forward the packet with the headers to donor eNB 102. Donor eNB 102 can obtain the packet, remove the IP header related to donor eNB 102, and forward the packet to relay eNB 104 based on the next IP header. Relay eNB 104 can similarly remove the header related to relay eNB 104, in one example, and relay eNB 104 can forward the packet to UE 110 based on the remaining IP header or another header. Though one relay eNB 104 is shown between UE 110 and donor eNB 102, it is to be appreciated that additional relay eNBs can exist, and IP headers can be added to uplink and downlink packets, as described, for each relay eNB to facilitate packet routing.

Moreover, as described, since relay eNB 104 can connect as a UE to donor eNB 102, it can also be limited by donor eNB 102 to a number of radio bearers that can be established therewith. Relay eNB 104, however, can similarly allow UE 110, and/or one or more additional UEs, to establish a number of radio bearers with relay eNB 104. In this regard, radio bearers established between UE 110 and relay eNB 104 can be mapped to the limited radio bearers established between relay eNB 104 and donor eNB 102. In an example, core network 106 can perform such mapping to ensure routing of packets to relay eNB 104 through donor eNB 102. For example, core network 106 can communicate radio bearer or related tunnel identifiers among components of the core network 106 to ensure the proper routing. The identifiers can be specified, for example, using IP headers established by the components of core network 106, utilizing or modifying service data flow (SDF) filters, and/or the like.

Based on the identifiers, for example, core network 106 can deliver packets to donor eNB 102 in tunnels corresponding to radio bearers established between donor eNB 102 and the appropriate relay eNB 104. This can include adding a tunneling protocol header to the packets and transmitting the packets with the tunneling headers to donor eNB 102. Donor eNB 102 can transmit the packets to relay eNB 104 over the radio bearers related to the tunnels. Relay eNB 104 can receive the packets and provide to UE 110 over an established radio bearer based at least in part on one or more parameters of the packet or one or more headers thereof. Where one or more intermediary relay eNBs are present between relay eNB 104 and donor eNB 102, the intermediary relay eNBs can similarly establish radio bearers for communicating with donor eNB 102 (or another upstream eNB). Thus, for example, core network 106 can deliver packets to donor eNB 102 and intermediary relay eNBs (via donor eNB 102) using tunnels associated with the radio bearers established with downstream relay eNBs.

Figure 2:
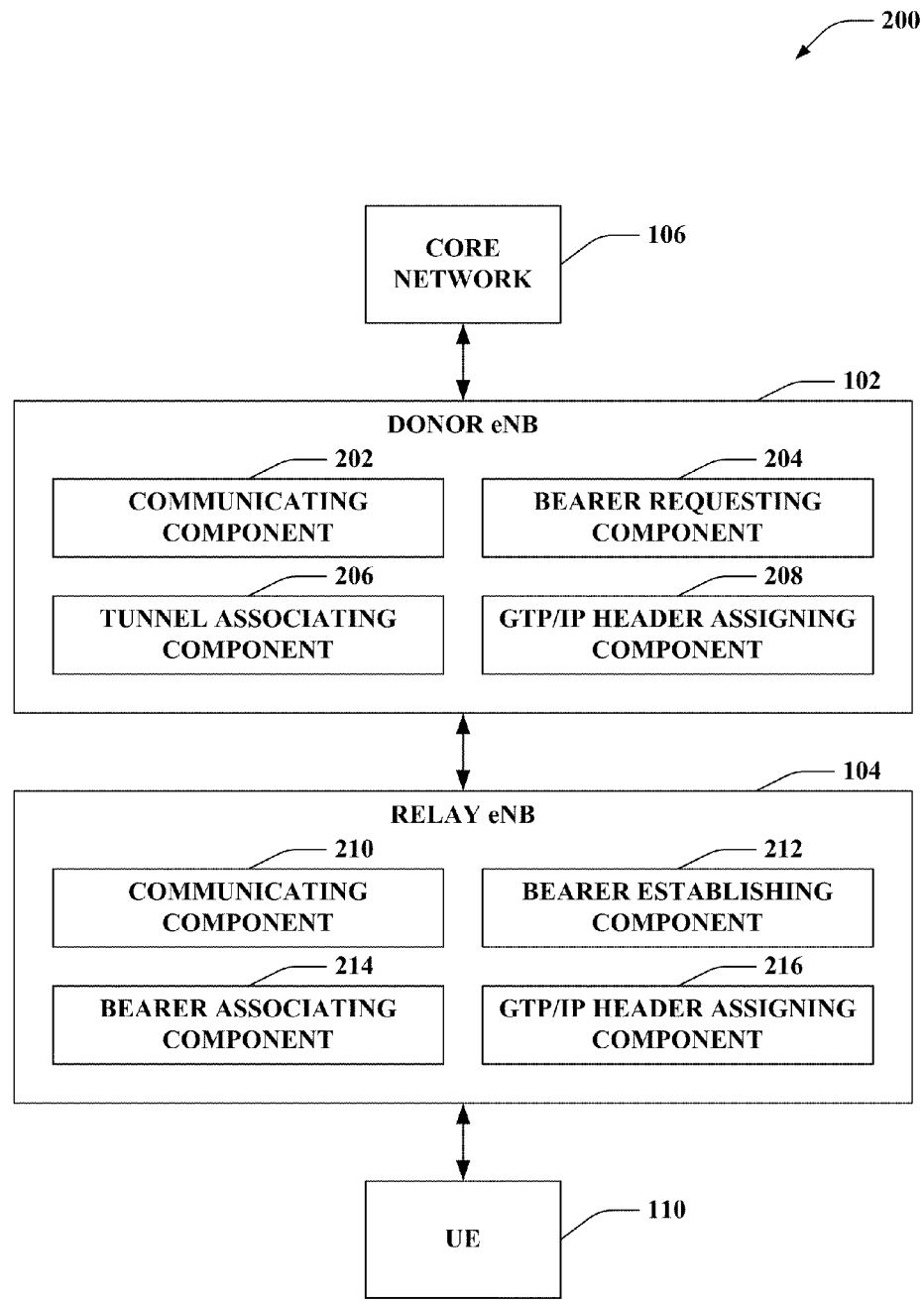
FIG. 2 is an illustration of an example wireless communications system that facilitates establishing radio bearers and/or related tunnels for routing packets.

Turning to FIG. 2, a wireless communication system 200 is illustrated that facilitates supporting IP relay communications in a wireless network. System 200 includes a donor eNB 102 that provides one or more relay eNBs, such as relay eNB 104, with access to a core network 106. Similarly, relay eNB 104 can provide one or more disparate relay eNBs or UEs, such as UE 110, with access to the core network 106 via donor eNB 102, as described. Moreover, donor eNB 102 can be a macrocell access point, femtocell access point, picocell access point, mobile base station, and/or the like. Relay eNB 104 can similarly be a mobile or stationary relay node that communicates with donor eNB 102 over a wireless or wired backhaul, as described.

Donor eNB 102 can include a communicating component 202 that transmits data to and/or receives data from a relay eNB over an access link and/or a core network over a backhaul link to provide access to the relay eNB and a bearer requesting component 204 that transmits a request for bearer establishment to the relay eNB. Donor eNB 102 also includes a tunnel associating component 206 that assigns a communications tunnel, such as a general packet radio service (GPRS) tunneling protocol (GTP) tunnel or similar tunnel, to an established bearer, and a GTP/IP header assigning component 208 that adds a GTP and/or IP header to an upstream packet to facilitate routing in a core network.

Relay eNB 104 includes a communicating component 210 that transmits data to and/or receives data from a UE or other relay eNBs over an access link and/or a donor eNB or one or more upstream relay eNBs over a backhaul link. Relay eNB 104 also includes a bearer establishing component 212 that initializes a radio bearer with the donor eNB or one or more upstream relay eNBs, a bearer associating component 214 that correlates communications from a UE or disparate relay eNB to a radio bearer with the donor eNB or one or more upstream relay eNBs, and a GTP/IP header assigning component 216 that associates a GTP and/or IP header to the communications for forwarding to a PGW/SGW, MME, or other core network component.

According to an example, bearer requesting component 204 can transmit a request to establish one or more radio bearers with relay eNB 104 to facilitate providing access to core network 106. For instance, bearer requesting component 204 can transmit the request based at least in part on receiving a request to establish the bearer from an upstream component of the core network 106. This can be in response to relay eNB 104 establishing a connection to donor eNB 102 to receive core network 106 access, a request from relay eNB 104 to establish an additional radio bearer (e.g., based on a desired quality of service (QoS) from UE 110), etc. Bearer establishing component 212 can initialize the radio bearer with donor eNB 102. In addition, tunnel associating component 206 can correlate the radio bearer to a GTP or other communications tunnel established with a component of core network 106 based on establishment of the radio bearer. In this regard, for example, communications received over the radio bearer by donor eNB 102 can be transmitted to core network 106 over the GTP tunnel.

In addition, as described, relay eNB 104 can establish a number of radio bearers with UE 110 and other UEs, while being limited to a number of bearers that can be established with donor eNB 102. Thus, for example, relay eNB 104 can map bearers established with UE 110 to those established with donor eNB 102. In one example, communicating component 210 can obtain a packet from UE 110 for providing to a component of core network 106. Bearer associating component 214 can assign the packet to a radio bearer established with donor eNB 102 for tunneling to core network 106. In an example, bearer associating component 214 can assign the packet to the radio bearer based at least in part on a type of communication related to the packet, a radio bearer over which the packet is received from UE 110, QoS parameters related thereto, a load on one or more disparate tunnels, and/or the like.

Moreover, the packet can include an IP header assigned by UE 110 to facilitate routing the packet to a component of core network 106 related to the UE. Thus, for example, the packet received from UE 110 can have a structure similar to the following.

| L1 | MAC | Radio Link Control (RLC) | Packet Data Convergence Protocol (PDCP) | IP Packet |
|---|---|---|---|---|

In addition, GTP/IP header assigning component 216 can include a GTP header and/or another user datagram protocol (UDP)/IP header in the packet, which respectively can include a TEID of a component in core network 106 related to the UE and an IP address of a destination node in core network 106. For example, the TEID and/or IP address can be received by relay eNB 104 and stored during establishment of a radio bearer between UE 110 and relay eNB 104 and/or based on a disparate message related to the radio bearer. In an example, the TEID can be assigned by one or more components of the core network 106, donor eNB 102 and/or relay eNB 104, to relate to UE 110 and the radio bearer established with relay eNB 104. For example, where the TEID is defined at least in part by donor eNB 102 and/or relay eNB 104, the TEID can be provided to one or more components of core network 106 to facilitate downlink packet routing. In this regard, the structure after adding the GTP and/or UDP/IP headers can be similar to the following.

| L1 | MAC | RLC | PDCP | UDP/IP header (with IP of UE's PGW/SGW) | GTP header (with TEID of UE's SGW) | IP Packet |
|---|---|---|---|---|---|---|

Communicating component 210 can transmit the packet over the radio bearer selected by bearer associating component 214. Communicating component 202 can obtain the packet. Tunnel associating component 206 can select a GTP or similar tunnel over which to transmit the packet to a component of core network 106, such as an MME, PGW/SGW, etc. As described, tunnel associating component 206 can select the tunnel according to a QoS of the packet, which can be indicated in the packet, inferred based on the radio bearer over which the packet is received by communicating component 202, and/or the like. In addition, GTP/IP header assigning component 208 can insert a GTP and/or UDP/IP header related in the packet, which can respectively include a TEID of a component in core network 106 related to relay eNB 104 and an IP address of the component. In this regard, the packet can have a structure similar to the following.

| L1/L2 | UDP/IP Header (with IP of ReNB's PGW/SGW) | GTP Header (with TEID of ReNB's SGW) | UDP/IP header (with IP of UE's PGW/SGW) | GTP header (with TEID of UE's SGW) | IP Packet |
|---|---|---|---|---|---|

Communicating component 202 can provide the packet to core network 106 over the tunnel, as described, using a backhaul link. Core network 106 can utilize the headers to route the IP packet to an appropriate node (e.g., a PGW/SGW or MME related to UE 110) and/or to associate downlink packets to the tunnel. Though one relay eNB 104 is shown, it is appreciated that one or more intermediary relay eNBs can exist between relay eNB 104 and donor eNB 102. The intermediary relay eNBs, for example, can similarly include the components of relay eNB 104 to associate packets to a tunnel with further upstream eNBs and include IP headers for routing the packet within core network 106.

In an example, UE 110 can request voice-over-internet protocol (VoIP) services from relay eNB 104, which can forward the request to donor eNB 102 and up to core network 106. Core network 106 can establish an evolved packet system (EPS) or similar bearer for VoIP communications and can transmit a radio bearer establishment request downstream to donor eNB 102. Donor eNB 102 can forward the request to relay eNB 104, which can establish the radio bearer with UE 110. Core network 106 can also assign an identifier, such as a downlink (DL)-tunnel endpoint identifier (TEID), to the EPS bearer related to VoIP services for UE 110, and can provide the identifier with the bearer establishment request. In addition, bearer establishing component 212 can have previously established a radio bearer with donor eNB 102 for communicating with core network 106; in one example, the established radio bearer can relate to communicating VoIP packets and/or similar packets related to services requiring a similar QoS.

In this regard, bearer associating component 214 can correlate packets related to the identifier and received from UE 110 to the radio bearer established with donor eNB 102. Thus, communicating component 210 can receive a VoIP packet from UE 110, which can include the identifier. Based on the identifier, for example, bearer associating component 214 can determine that the packet is related to the established radio bearer with donor eNB 102. GTP/IP header assigning component 216 can additionally associate a GTP and/or UDP/IP header with the packet that includes a TEID and/or an IP address of a destination node to facilitate routing the packet to a PGW/SGW or other component of core network 106 related to relay eNB 104, as described. Communicating component 210 can transmit the VoIP packet to donor eNB 102 over the associated radio bearer. Communicating component 202 can obtain the packet over the radio bearer with relay eNB 104, and tunnel associating component 206 can discern a GTP tunnel for packets received over the radio bearer. GTP/IP header assigning component 208 can further associate a GTP and/or UDP/IP header with the packet for forwarding the packet to a component in core network 106 related to relay eNB 104. Communicating component 202 can transmit the packet to the related component of core network 106. Core network 106 can route the packet accordingly based at least in part on the headers (e.g., according to IP address, TEID, and/or the like), as described further herein.

Figure 3:
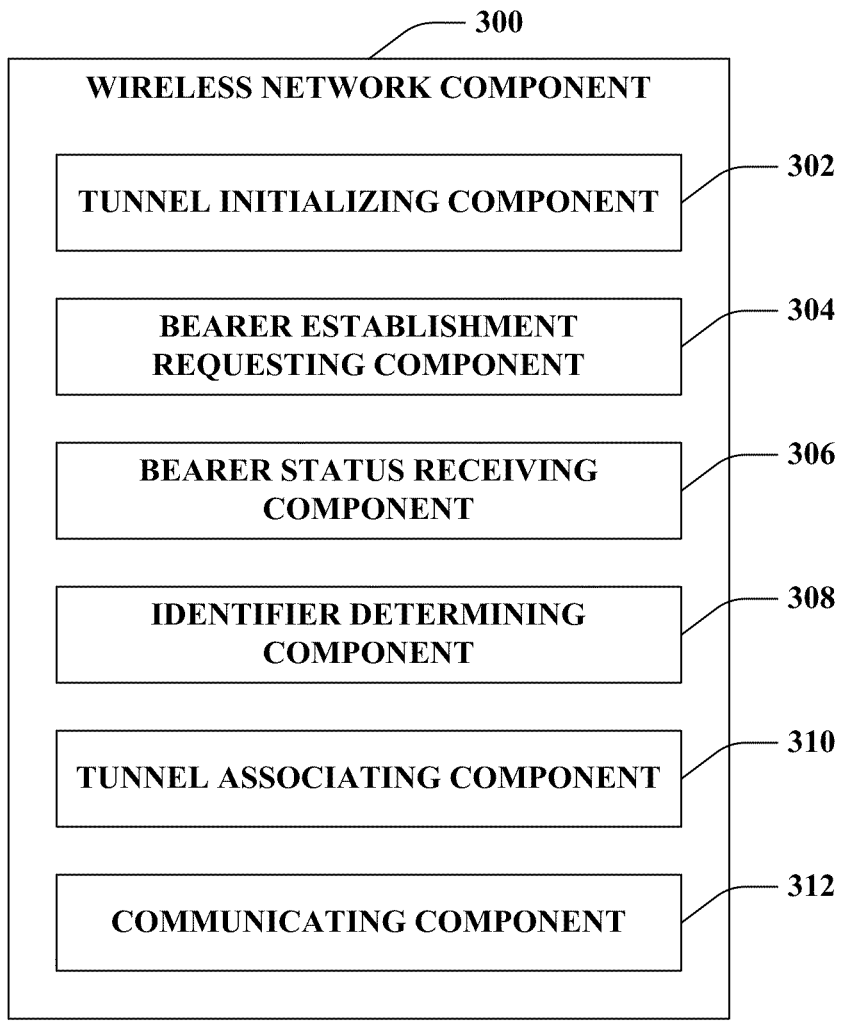
FIG. 3 is an illustration of an example wireless network component for employment within a wireless communications environment.

Referring to FIG. 3, illustrated is a wireless network component 300 for employment within a wireless communications environment. The wireless network component 300 can be a gateway or other component that allows other devices to access components of a wireless network. For example, wireless network component 300 can communicate with one or more devices, such as access points (e.g., via one or more radio network controllers), etc., over an IP application layer. In addition, wireless network component 300 can connect to the one or more devices over a wired or wireless link. Moreover, wireless network component 300 can communicate with other gateways, mobility management entities (MME), and/or the like to provide wireless network access to the one or more devices.

Wireless network component 300 can include a tunnel initializing component 302 that establishes one or more communication tunnels with the one or more devices, a bearer establishment requesting component 304 that can generate a bearer establishment request related to providing network access to a UE, and a bearer status receiving component 306 that can determine whether the bearer is successfully established with the UE. Wireless network component 300 further includes an identifier determining component 308 that obtains an identifier, such as a DL-TEID, related to the established bearer, a tunnel associating component 310 that correlates the UE and the TEID to a communication tunnel, and a communicating component 312 that transmits data to, and receives data from, the one or more devices, and/or upstream network components.

According to an example, tunnel initializing component 302 can create a communications tunnel with a donor eNB to facilitate communicating with a relay eNB or other downstream node. For example, the tunnel can be a GTP tunnel, or a similar tunnel, and can be created upon receiving a request from an upstream node, such as PGW/SGW, MME, and/or the like. In one example, tunnel initializing component 302 can create a tunnel with the donor eNB corresponding to each radio bearer established between the donor eNB and a relay eNB related to the wireless network component 300. Thus, in one example, tunnel initializing component 302 can establish the tunnel with the donor eNB corresponding to a given radio bearer during a radio bearer establishment procedure between the donor eNB and relay eNB.

In addition, for example, communicating component 312 can receive a bearer establishment request from a disparate network component (not shown), such as a PGW/SGW, MME, etc., related to a UE served by the relay eNB. Bearer establishment requesting component 304 can forward the bearer establishment request to one or more devices, such as a donor eNB that communicates with the UE through the relay eNB (and/or one or more intermediary relay eNBs). In one example, bearer establishment requesting component 304 can add a header to the bearer establishment request, as described herein, to facilitate routing the request to a relay eNB that serves the UE via the donor eNB and/or one or more intermediary relay eNBs.

Bearer status receiving component 306 can subsequently obtain a status regarding establishing the bearer, which can be received from the donor eNB over communicating component 312. It is to be appreciated that the status can be provided to the donor eNB by the relay eNB, which attempts bearer establishment with the UE. If status indicates the bearer is established with the UE, identifier determining component 308 can discern an identifier for communicating packets to the UE. As described, the identifier can be a DL-TEID or similar identifier, which can be at least partially assigned by a PGW/SGW, MME, the donor eNB, the relay eNB, and/or the like. In one example, the identifier determining component 308 can retrieve the identifier from the status received by bearer status receiving component 306. In another example, the donor eNB can provide the identifier to wireless network component 300 (upon request from the relay eNB, for example) in a disparate message.

In an example, tunnel associating component 310 can correlate the UE (e.g., by a received IP address) and the identifier to a tunnel established with the donor eNB corresponding to a related radio bearer between the donor eNB and relay eNB, as described. In one example, the related radio bearer can be specified in the status as well, determined based at least in part on an uplink tunnel over which the status is received by communicating component 312, and/or the like. In this regard, subsequent communications intended for UE over the established bearer can be received by communicating component 312, and tunnel associating component 310 can determine a tunnel for the communications (e.g., based on an identifier, an SDF filtering of one or more headers, and/or the like, as described further herein).

In another example, a PGW/SGW, MME, etc. related to the UE can be multi-homed such that it provides disparate IP addresses to a given UE based at least in part on a radio bearer of the UE established with the relay eNB. In this regard, tunnel associating component 310 can determine a tunnel related to communications for UE received over communicating component 312 based on the IP address. Thus, for example, communicating component 312 can additionally receive a disparate communication related to the UE having a disparate IP address, and tunnel associating component 310 can map the communication to a disparate tunnel. In any case, it is to be appreciated that based at least in part on the tunnel over which the communications are received from wireless network component 300, the donor eNB can then route the communications to a relay eNB over the appropriate established radio bearer related to the tunnel. This can include inserting a tunneling protocol header (such as a GTP header) in the packet related to transmitting in the tunnel. Communicating component 312 can thus transmit the packet with the tunneling protocol header to the donor eNB. In this regard, QoS can be provided for communications to the UE.

Figure 4:
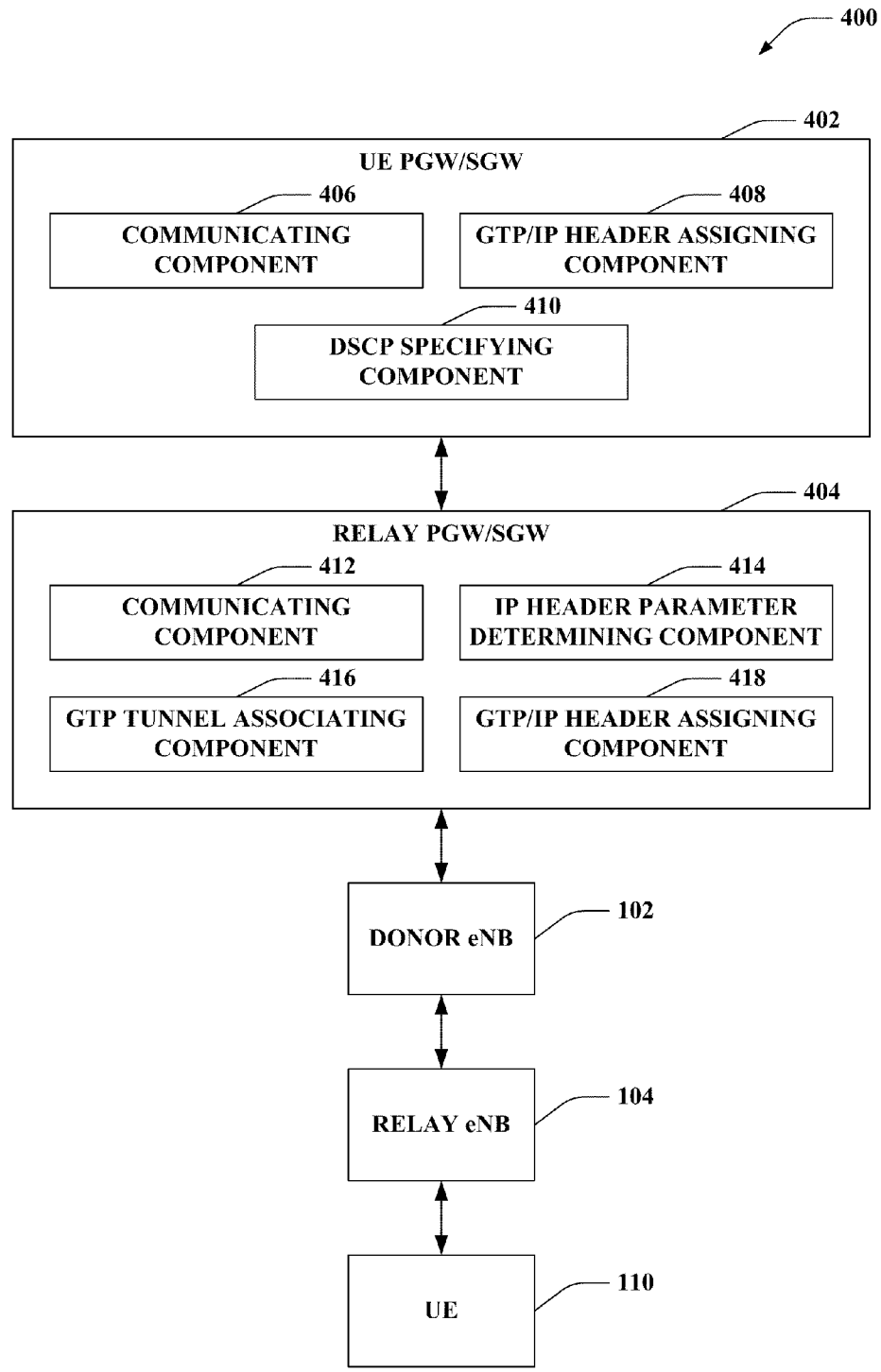
FIG. 4 is an illustration of an example wireless communications system that maps quality of service (QoS) bearers according to IP header parameters.

Turning now to FIG. 4, an example wireless communication system 400 that facilitates routing packets among multiple gateways for providing to devices in a wireless network is illustrated. System 400 includes a UE PGW/SGW 402 that provides IP layer communications to one or more UEs through one or more disparate components. In addition, system 400 includes a relay PGW/SGW 404 that similarly provides IP layer communications to one or more relay eNBs. System 400 includes a donor eNB 102 that provides relay eNB 104 (and/or other relay eNBs) with access to the PGW/

SGWs 402 and 404 (as well as other components, in one example). Additionally, as described, relay eNB 104 can provide one or more additional relay eNBs and/or UEs with access to the PGW/SGWs 402 and 404 through the donor eNB 102. Moreover, donor eNB 102 can be a macrocell access point, femtocell access point, picocell access point, mobile base station, and/or the like. Relay eNB 104 can similarly be a mobile or stationary relay node that communicates with donor eNB 102 over a wireless or wired backhaul, as described.

UE PGW/SGW 402 comprises a communicating component 406 that can transmit data to, and/or receive data from, a relay PGW/SGW, MME, and/or one or more disparate network components to facilitate providing wireless network access over an IP layer. UE PGW/SGW 402 also includes a GTP/IP header assigning component 408 that can associate a GTP and/or UDP/IP header with communications to the relay PGW/SGW and/or one or more downstream network components for routing to a device indicated in the IP header, and a DSCP specifying component 410 that can include a differentiated services (DiffServ) code point (DSCP) or other similar parameter in the IP header.

Relay PGW/SGW 404 includes a communicating component 412 that can transmit data to, and/or receive data from, a UE PGW/SGW, MME, a donor eNB 102, etc. and an IP header parameter determining component 414 that obtains a parameter from an IP header of one or more received communications. Relay PGW/SGW 404 additionally includes a GTP tunnel associating component 416 that determines a GTP tunnel with a donor eNB that is related to the communications based at least in part on the parameter and a GTP/IP header assigning component 418 that associates another GTP and/or UDP/IP header with the communications.

As described, for example, donor eNB 102 can provide relay eNB 104 with access to one or more core network components, such as relay PGW/SGW 404. Relay eNB 104 can establish IP communications with relay PGW/SGW 404 and receive an IP address therefrom, and donor eNB 102 can initialize one or more GTP tunnels with the relay PGW/SGW 404 for relay eNB 104 communications. Similarly, relay eNB 104 can provide UE 110 with access to one or more core network components, such as UE PGW/SGW 402, via donor eNB 102. UE 110 can establish IP communications with UE PGW/SGW 402, receiving an IP address therefrom, and relay eNB 104 can initialize one or more GTP tunnels with the UE PGW/SGW 402, through donor eNB 102 and relay PGW/SGW 404 for UE communications. Thus, relay eNB 104 can receive uplink IP communications from UE 110. Relay eNB 104 can add a GTP and/or UDP/IP header for tunneling to UE PGW/SGW 402 and can transmit to donor eNB 102. Similarly, donor eNB 102 can add a GTP and/or UDP/IP header for tunneling to relay PGW/SGW 404, as described.

In addition, however, relay eNB 104 can establish multiple radio bearers with each of a plurality of UEs, and can be limited in a number of radio bearers it can establish with donor eNB 102. In this regard, relay eNB 104 can map each of the multiple radio bearers to a radio bearer between relay eNB 104 and donor eNB 102. In one example, relay eNB 104 can select the radio bearer based at least in part on a type of communications received over the radio bearer between relay eNB 104 and UE 110, QoS, or one or more additional parameters of the communications or radio bearer over which the communications are received from UE 110. Thus, for example, one or more radio bearers established between relay eNB 104 and donor eNB 102 can be associated with a QoS and/or a DSCP. In another example, the one or more radio bearers can be associated with a range of QoS or DSCP.

It is to be appreciated that relay eNB 104 can assign the QoS or DSCP to the radio bearers with donor eNB 102, receive the assignment as part of a configuration, specification, or hardcoding, receive the assignment when establishment of the bearers is requested by relay PGW/SGW 404, and/or the like. The DSCP can be a 6-bit or similarly sized value determined based on a priority of the communications, desired or required QoS, and/or similar metrics. Relay eNB 104 can transmit communications received over a radio bearer with UE 110 to donor eNB 102 over the radio bearer with donor eNB 102 based on the DSCP, QoS requirements, etc. Donor eNB 102 can add GTP/IP headers, as described, and can forward the communications to relay PGW/SGW 404 based at least in part on the radio bearer over which the communications are received from relay eNB 104. Relay PGW/SGW 404 can forward the communications to UE PGW/SGW 402 based at least in part on a header added by relay eNB 104, as described, etc.

According to an example, communicating component 406 can obtain a downlink IP packet for UE 110 (e.g., by receiving the packet from an upstream network component, a disparate PGW/SGW, generating the packet, and/or the like). GTP/IP header assigning component 408 can associate a GTP and/or UDP/IP header with the packet to facilitate routing the packet to UE 110. For example, the GTP header can include a TEID related to the relay eNB 104. In an example, the TEID can relate to a DL-TEID assigned by UE PGW/SGW 402 or a disparate network component for to facilitate identifying a radio bearer between UE 110 and relay eNB 104. Similarly, for example, the UDP/IP header can include an address for UE 110 assigned by UE PGW/SGW 402.

Moreover, for example, DSCP specifying component 410 can set a DSCP or one or more disparate parameters in the IP header to apply differentiated services architecture providing QoS for the packet. In one example, the IP header can be an IP version 4 (IPv4) header including a Type of Service field that can comprise the DSCP. Similarly, the IP header can be an IP version 6 (IPv6) header that includes a Traffic Class field comprising the DSCP. In this regard, the packet can have a protocol structure similar to the following.

| L1/L2 | UDP/IP header (with IP of relay eNB) | GTP header (with TEID of relay eNB) | IP Packet |
|---|---|---|---|

Communicating component 406 can transmit the packet to relay PGW/SGW 404 (e.g., over a wired backhaul or similar core network connection).

Communicating component 412 can receive the packet from UE PGW/SGW 402. IP header parameter determining component 414 can discern one or more parameters in the IP header of the packet, such as an IP address, DSCP or similar parameters, etc. Based at least in part on the IP address and/or the DSCP, GTP tunnel associating component 416 can match the packet with a GTP tunnel of donor eNB 102, which corresponds to a radio bearer between relay eNB 104 and donor eNB 102, as described. In addition, GTP/IP header assigning component 418 can add a GTP and/or UDP/IP header to the packet to facilitate tunneling the packet through donor eNB 102. Thus, for example, the packet can have a protocol structure similar to the following.

| L1/L2 | UDP/IP header (with IP of donor eNB) | GTP header (with TEID of donor eNB) | UDP/IP header (with IP of relay eNB) | GTP header (with TEID of relay eNB) | IP Packet |
|---|---|---|---|---|---|

Communicating component 412 can transmit the packet to donor eNB 102 over the GTP tunnel Donor eNB 102 can determine that the packet relates to relay eNB 104 (e.g., based on the IP header) and can transmit at least a portion of the packet to relay eNB 104 over a radio bearer related to the GTP tunnel over which the packet is received. For example, donor eNB 102 can remove the GTP and UDP/IP header related to donor eNB 102 and transmit the remaining packet to relay eNB 104. Thus, for example, the packet can have a protocol structure similar to the following upon receipt at relay eNB 104.

| L1 | MAC | RLC | PDCP | UDP/IP header (with IP of relay eNB) | GTP header (with TEID of relay eNB) | IP Packet |
|---|---|---|---|---|---|---|

Relay eNB 104 can similarly receive the packet, remove the UDP/IP and GTP header related to relay eNB 104, and forward to UE 110 (e.g., based at least in part on an IP address in the IP packet header related to UE 110). In addition, for example, relay eNB 104 can select a radio bearer over which to transmit the packet to UE 110 based at least in part on the TEID specified in the GTP header.

In an example, UE 110 can transmit a VoIP packet to relay eNB 104. Relay eNB 104 can add a GTP and/or UDP/IP header to the packet and communicate the packet to donor eNB 102 over a radio bearer related to communicating VoIP or other communications requiring a similar QoS. Donor eNB 102 can tunnel the communications to relay PGW/SGW 404 using a GTP tunnel associated with the radio bearer, for example. Relay PGW/SGW 404 can receive the packet and forward to UE PGW/SGW based on one or more headers, as described. Communicating component 202 can receive a responding packet or other packet related to VoIP communications with UE 110 from an upstream node, MME, disparate PGW/SGW, and/or the like. GTP/IP header assigning component 408 can associate a GTP and/or UDP/IP header to the responding packet for routing the packet to UE 110. Moreover, DSCP specifying component 410 can include a DSCP or similar parameter related to VoIP communications in the IP header. In one example, DSCP specifying component 410 can determine a QoS or communication type of the packet based at least in part on a DL-TEID in the packet, a core network bearer related to the packet, and/or the like. Communicating component 406 can transmit the packet to relay PGW/SGW 404.

Communicating component 412 can obtain the packet. IP header parameter determining component 414 can extract the DSCP or similar parameter to determine a GTP tunnel for the packet. Since the DSCP or similar parameter indicates the packet related to VoIP, GTP tunnel associating component 416 can select the GTP tunnel associated with a radio bearer between relay eNB 104 and donor eNB 102 that corresponds to VoIP or communications with similar QoS. GTP/IP header assigning component 418 can further include a GTP and/or UDP/IP header for routing the packet to relay eNB 104, as described. Communicating component 412 can tunnel the packet to donor eNB 102 for transmitting to relay eNB 104. For example, donor eNB 102 can transmit to relay eNB 104 over a radio bearer related to the GTP tunnel Relay eNB 104 can forward the packet to UE 110 based on the UDP/IP header provided by GTP/IP header assigning component 408, a TEID relating to a bearer between UE 110 and relay eNB 104, and/or the like.

Figure 5:
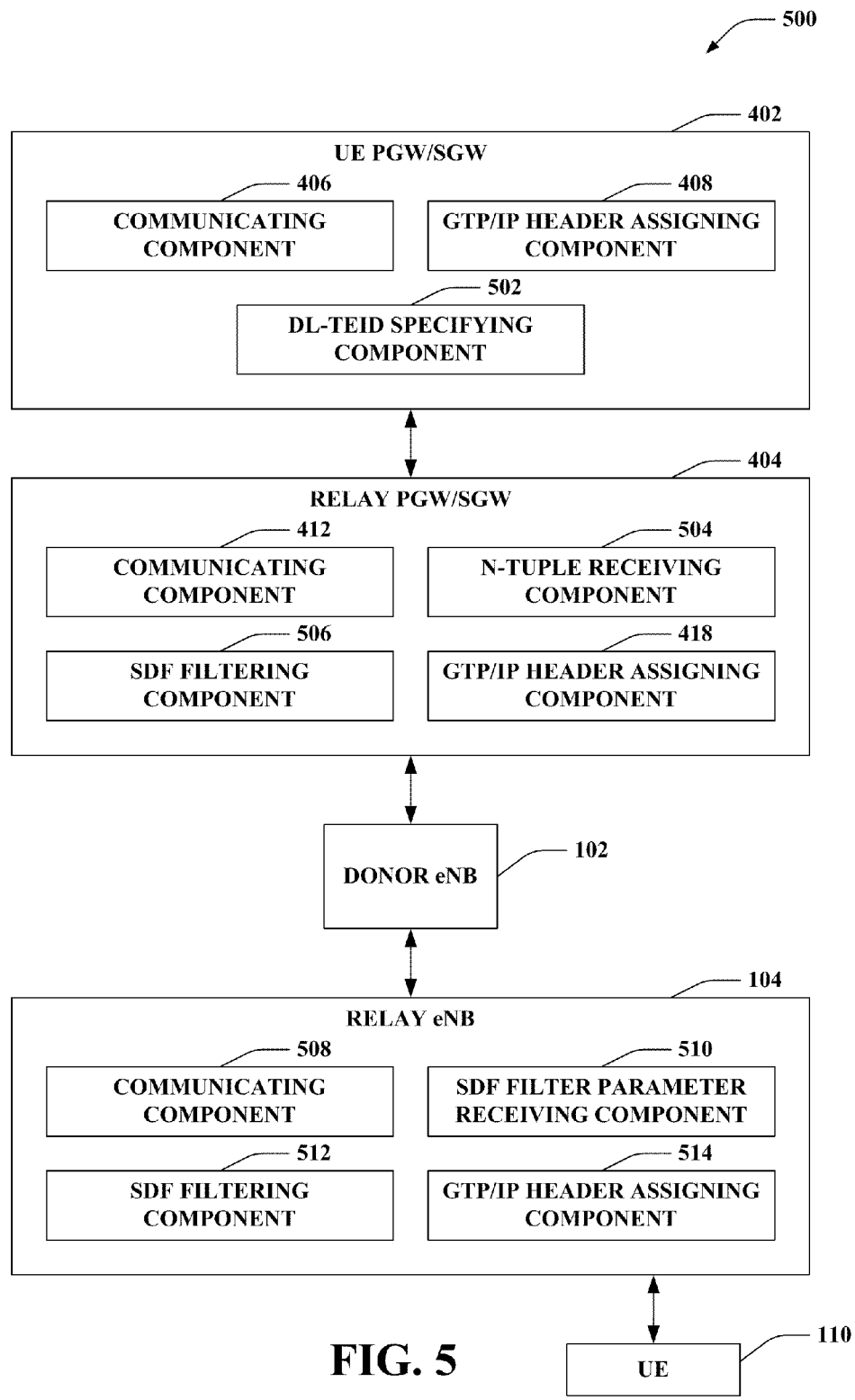
FIG. 5 is an illustration of an example wireless communications system that filters packets to a communication tunnel based at least in part on a tunnel endpoint identifier (TEID).

Referring to FIG. 5, an example wireless communication system 500 that facilitates routing packets among multiple gateways for providing to devices in a wireless network using SDF filtering is illustrated. System 500 includes a UE PGW/SGW 402 that provides IP layer communications to one or more UEs through one or more disparate components. In addition, system 500 includes a relay PGW/SGW 404 that similarly provides IP layer communications to one or more relay eNBs. System 500 includes a donor eNB 102 that provides relay eNB 104 (and/or other relay eNBs) with access to the PGW/SGWs 402 and 404 (as well as other components, in one example). Additionally, as described, relay eNB 104 can provide one or more additional relay eNBs and/or UEs, such as UE 110, with access to the PGW/SGWs 402 and 404 through the donor eNB 102. Moreover, donor eNB 102 can be a macrocell access point, femtocell access point, picocell access point, mobile base station, and/or the like. Relay eNB 104 can similarly be a mobile or stationary relay node that communicates with donor eNB 102 over a wireless or wired backhaul, as described.

UE PGW/SGW 402 comprises a communicating component 406 that can transmit data to, and/or receive data from, a relay PGW/SGW, MME, and/or one or more disparate network components to facilitate providing wireless network access over an IP layer. UE PGW/SGW 402 also includes a GTP/IP header assigning component 408 that can associate a GTP and/or UDP/IP header with communications to the relay PGW/SGW and/or one or more downstream network components for routing to a device indicated in the IP header and a DL-TEID specifying component 502 that can include a DL-TEID or other identifier received upon attachment of the device in the communications.

Relay PGW/SGW 404 includes a communicating component 412 that can transmit data to, and/or receive data from, a UE PGW/SGW, MME, a donor eNB, etc., and an N-tuple receiving component 504 that obtains an N-tuple from one or more headers of a received packet. Relay PGW/SGW 404 additionally includes an SDF filtering component 506 that can specify a QoS of the packet over a backhaul link (e.g., by routing the packet to a GTP tunnel) based at least in part on the N-tuple and a GTP/IP header assigning component 418 that associates another GTP and/or UDP/IP header with the communications.

Relay eNB 104 includes a communicating component 508 that transmits data to, and/or receives data from one or more upstream eNBs and/or a UE and an SDF filter parameter receiving component 510 that obtains an SDF filter and/or one or more parameters related thereto from a relay PGW/SGW related to relay eNB 104. Relay eNB 104 further includes an SDF filtering component 512 that routes one or more packets received from a UE to one or more bearers established with the one or more upstream eNBs based at least in part on the SDF filter and/or one or more parameters and a GTP/IP header assigning component 418 that associates another GTP and/or UDP/IP header with the communications.

According to an example, communicating component 406 can obtain a downlink packet for UE 110 (e.g., by receiving the packet from an upstream network component, a disparate PGW/SGW, generating the packet, and/or the like), as described. GTP/IP header assigning component 408 can associate a GTP and/or UDP/IP header with the packet to facilitate routing the packet to UE 110. For example, the IP header can include an IP address for UE 110 assigned by UE PGW/SGW 402. In addition, DL-TEID specifying component 502 can include a DL-TEID related to UE 110 in the GTP header. As described, for example UE PGW/SGW 402 can receive the DL-TEID from the relay PGW/SGW 404, which can receive from the donor eNB 102, etc., as part of a bearer establishment procedure (e.g., a status message, as described). Thus, the DL-TEID can more specifically relate to a radio bearer established between the relay eNB 104 and UE 110, as described above. In this regard, DL-TEID specifying component 502 can determine the DL-TEID for the packet based at least in part on an IP address in the packet (e.g., which can relate to UE 110), a type of the traffic, one or more identifiers specified in a related uplink packet, and/or the like.

Communicating component 406 can transmit the packet to relay PGW/SGW 404 (e.g., over a wired backhaul or similar core network connection). Communicating component 412 can receive the packet from UE PGW/SGW 402. N-tuple receiving component 504 can determine an N-tuple (e.g., N elements of an ordered list where N is a positive integer) from one or more headers of the packet. For example, N can be 6, and thus N-tuple receiving component 504 can obtain and process a 6-tuple from the packet. For example, the 6-tuple can correspond to a source IP address, destination IP address, source port number, destination port number, protocol, and DL-TEID from an IP header, user datagram protocol (UDP) header, and GTP header. In this regard, SDF filtering component 506 can include a predefined policy and charging control (PCC) rule for an SDF flow filter that can process 6-tuples from the three headers including the above parameters. The SDF filtering component 506 can associate the processed 6-tuples with a QoS (or related tunnel), for example, using the SDF flow filter. For example, the SDF flow filter can relate to a set of IP header parameter values and/or ranges (e.g., 6-tuples) used to identify the QoS, which can include determining one or more packet flows (e.g., tunnels) constituting an SDF.

In addition, for example, relay eNB 104 can pre-allocate the DL-TEID for UE 110 and its related radio bearer with relay eNB 104 upon receiving a request to establish the radio bearer. Relay eNB 104 can further transmit the 6-tuple (including the source IP address, destination IP address, source port number, destination port number, protocol, and DL-TEID) related to UE 110 and its radio bearer with relay eNB 104 to relay PGW/SGW 404. Thus, SDF filtering component 506 can associate the received 6-tuple (e.g., in an SDF flow filter) with a GTP tunnel corresponding to a radio bearer established between relay eNB 104 and donor eNB 102 (e.g., based on an identifier of the GTP tunnel sent with the 6-tuple or a related message, determining the GTP tunnel over which the 6-tuple is received, etc.). Thus, once N-tuple receiving component 504 processes the 6-tuple, SDF filtering component 506 can determine the related GTP tunnel for the 6-tuple based on the association of the 6-tuple to the GTP tunnel. GTP/IP header assigning component 418 can add a GTP and/or UDP/IP header to the packet to facilitate routing to donor eNB 102, and communicating component 412 can transmit the packet to relay eNB 104 over the GTP tunnel through donor eNB 102, as described previously.

In addition, for example, SDF filtering component 506 can provide parameters related to the SDF filter to relay eNB 104 to facilitate similar filtering for uplink packets. SDF filter parameter receiving component 510 can obtain the parameters, and SDF filtering component 512 can filter packets received at communicating component 508 from UE 110 to donor eNB 102 over radio bearers related to the associated GTP tunnel indicated by the SDF filter. In another example, upon providing the 6-tuple to relay PGW/SGW 404, as described above, SDF filtering component 506 can associate the 6-tuple with a GTP tunnel and can provide parameters of the GTP tunnel and/or the associated radio bearer established between donor eNB 102 and relay eNB 104 to relay eNB 104 (e.g., via donor eNB 102). SDF filter parameter receiving component 510 can obtain the parameters, and SDF filtering component 512 can associate the parameters with a similar 6-tuple (e.g., switching source and destination parameters) or a portion thereof. Thus, communicating component 508 can receive a packet from UE 110. SDF filtering component 512 can select a radio bearer over which to transmit the packet to donor eNB 102 based on a 5-tuple in a header of the packet (e.g., the source IP address, destination IP address, source port number, destination port number, and protocol) and a determined DL-TEID related to the packet. GTP/IP header assigning component 514 can associate a GTP and/or UDP/IP header to the packet, and communicating component 508 can transmit the packet to donor eNB 102, as described previously, for providing to UE PGW/SGW 402 through relay PGW/SGW 404.

Figure 6:
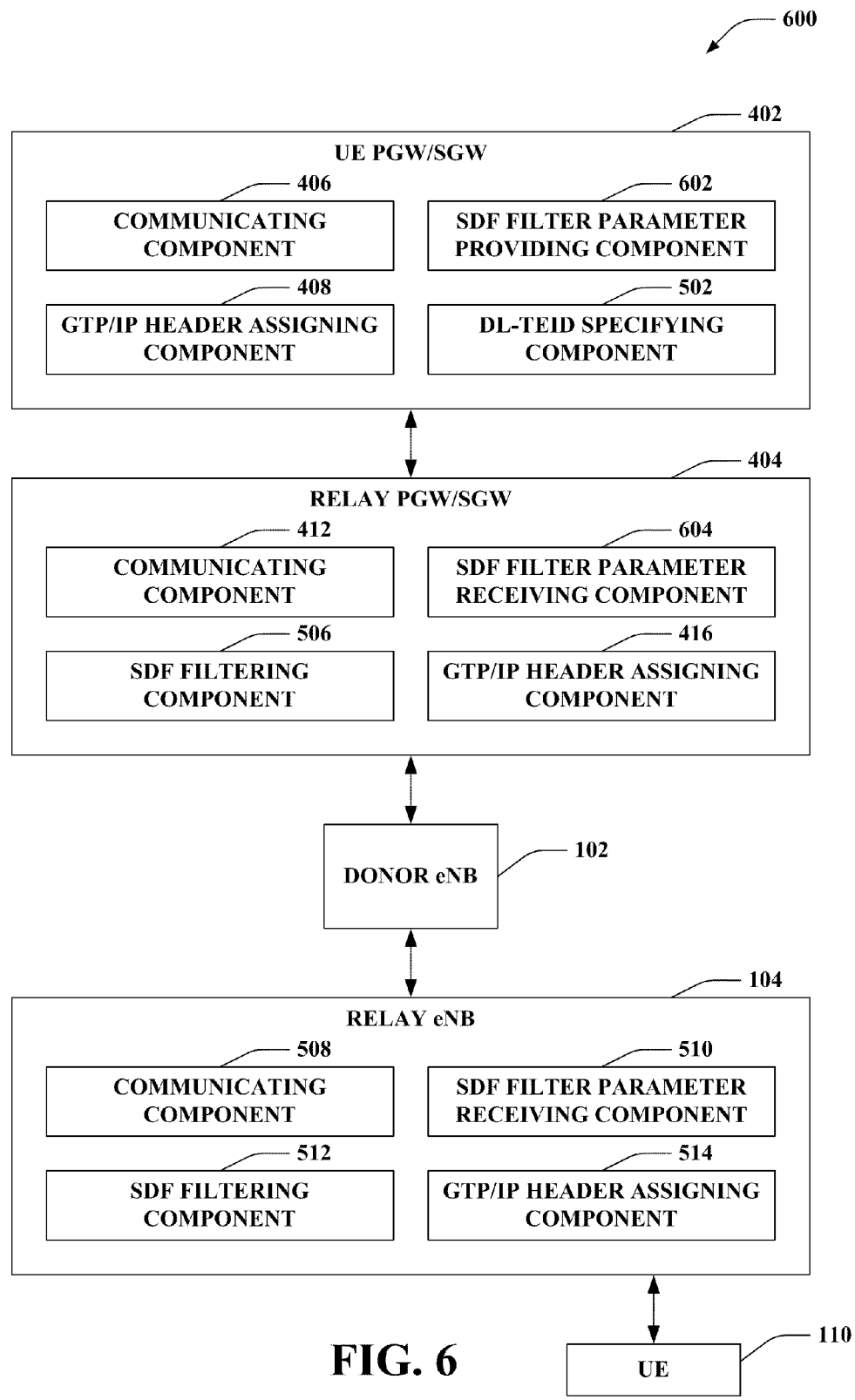
FIG. 6 is an illustration of an example wireless communications system that filters packets to a communication tunnel based on an inner-most header.

Turning now to FIG. 6, an example wireless communication system 600 that facilitates routing packets among multiple gateways for providing to devices in a wireless network using SDF filtering for inner-IP headers is illustrated. System 600 includes a UE PGW/SGW 402 that provides IP layer communications to one or more UEs through one or more disparate components. In addition, system 600 includes a relay PGW/SGW 404 that similarly provides IP layer communications to one or more relay eNBs. System 600 includes a donor eNB 102 that provides relay eNB 104 (and/or other relay eNBs) with access to the PGW/SGWs 402 and 404 (as well as other components, in one example). Additionally, as described, relay eNB 104 can provide one or more additional relay eNBs and/or UEs, such as UE 110, with access to the PGW/SGWs 402 and 404 through the donor eNB 102. Moreover, donor eNB 102 can be a macrocell access point, femtocell access point, picocell access point, mobile base station, and/or the like. Relay eNB 104 can similarly be a mobile or stationary relay node that communicates with donor eNB 102 over a wireless or wired backhaul, as described.

UE PGW/SGW 402 comprises a communicating component 406 that can transmit data to, and/or receive data from, a relay PGW/SGW, MME, and/or one or more disparate network components to facilitate providing wireless network access over an IP layer and an SDF filter parameter providing component 602 that can transmit one or more parameters for filtering packets using SDF to a disparate PGW/SGW (e.g., via communicating component 406 or otherwise). UE PGW/SGW 402 also includes a GTP/IP header assigning component 408 that can associate a GTP and/or UDP/IP header with communications to the relay PGW/SGW and/or one or more downstream network components for routing to a device indicated in the IP header and a DL-TEID specifying component 502 that can include a DL-TEID or other identifier received upon attachment of the device in the communications.

Relay PGW/SGW 404 includes a communicating component 412 that can transmit data to, and/or receive data from, a UE PGW/SGW, MME, a donor eNB, etc., and an SDF filter parameter receiving component 604 that obtains one or more parameters related to determining a QoS for one or more packets using an SDF filter (e.g., via communicating component 412 or otherwise). Relay PGW/SGW 404 additionally includes an SDF filtering component 506 that can route the packet to a GTP tunnel based at least in part on the SDF filter parameters and a GTP/IP header assigning component 418 that associates another GTP and/or UDP/IP header with the communications.

Relay eNB 104 includes a communicating component 508 that transmits data to, and/or receives data from one or more upstream eNBs and/or a UE and an SDF filter parameter receiving component 510 that obtains an SDF filter and/or one or more parameters related thereto from a relay PGW/SGW related to relay eNB 104. Relay eNB 104 further includes an SDF filtering component 512 that routes one or more packets received from a UE to one or more bearers established with the one or more upstream eNBs based at least in part on the SDF filter and/or one or more parameters and a GTP/IP header assigning component 418 that associates another GTP and/or UDP/IP header with the communications.

According to an example, relay eNB 104 can establish a bearer with UE 110, as described, which can cause UE PGW/SGW 402 to generate an IP address and/or UDP information for UE 110 and/or the established bearer. UE PGW/SGW 402 can communicate the address and/or information to UE 110 through relay PGW/SGW 404, donor eNB 102, relay eNB 104, etc., as described. In addition, SDF filter parameter providing component 602 can transmit the IP address, UDP information, etc. related to UE 110 as one or more parameters for an SDF filter to provide QoS for one or more packets. In one example, this can be a 5-tuple comprising a source IP address, destination IP address, source port number, destination port number, and protocol). SDF filter parameter receiving component 604 obtain the parameters, and SDF filtering component 506 can associate the parameters to a GTP tunnel related to the bearer established between relay eNB 104 and UE 110. As described, the GTP tunnel can relate to a GTP tunnel between relay PGW/SGW 402 and donor eNB 102 that corresponds to a radio bearer between donor eNB 102 and relay eNB 104 to provide a QoS desired or required for the radio bearer established between relay eNB 104 and UE 110.

In this regard, communicating component 406 can subsequently obtain a downlink packet for UE 110 (e.g., by receiving the packet from an upstream network component, a disparate PGW/SGW, generating the packet, and/or the like), as described. GTP/IP header assigning component 408 can associate a GTP and/or UDP/IP header with the packet to facilitate routing the packet to UE 110. For example, the IP header can include an IP address for UE 110 assigned by UE PGW/SGW 402. In addition, DL-TEID specifying component 502 can include a DL-TEID related to UE 110 in the GTP header. As described, for example UE PGW/SGW 402 can receive the DL-TEID from the relay PGW/SGW 404, which can receive from the donor eNB 102, etc., as part of a bearer establishment status. Thus, the DL-TEID can more specifically relate to a radio bearer established between the relay eNB 104 and UE 110, as described above. In this regard, DL-TEID specifying component 502 can determine the DL-TEID for the packet based at least in part on an IP address in the packet (e.g., which can relate to UE 110), an associated radio bearer between UE 110 and relay eNB 104, a type of the traffic, one or more identifiers specified in a related uplink packet, and/or the like.

Communicating component 406 can transmit the packet to relay PGW/SGW 404 (e.g., over a wired backhaul or similar core network connection). Communicating component 412 can receive the packet from UE PGW/SGW 402. SDF filtering component 506 can determine an inner-most header from the packet (e.g., a header nearest to the packet data). As described, the packet, upon arriving at relay PGW/SGW 404, can include a plurality of headers inserted by UE PGW/SGW 402, one or more additional PGW/SGWs, etc. In an example, the packet can have the following header format.

| IP source (UE PGW/SGW) | IP destination (ReNB) | UDP source | UDP destination | GTP header (with DL-TEID) | IP Packet (as received) |
|---|---|---|---|---|---|

SDF filtering component 506 can skip the outer IP/UDP headers and apply the SDF filter to the headers of the IP packet as received at UE PGW/SGW 402. In this regard, the IP packet as received can include parameters previously received as SDF filter parameters by SDF filter parameter receiving component 604, described above. Thus, SDF filtering component 506 can associate the packet to a GTP tunnel based at least in part on matching parameters (e.g., the 5-tuple) of the inner-most header to those received by SDF filter parameter receiving component 604. GTP/IP header assigning component 418 can add a GTP and/or UDP/IP header to the packet to facilitate routing to donor eNB 102, as described, and communicating component 412 can transmit the packet to relay eNB 104 over the GTP tunnel through donor eNB 102.

In addition, for example, SDF filtering component 506 can further provide received SDF filter parameters to relay eNB 104 to facilitate similar filtering for uplink packets. SDF filter parameter receiving component 510 can obtain the parameters, and SDF filtering component 512 can filter packets received at communicating component 508 from UE 110 to donor eNB 102 over radio bearers related to the associated GTP tunnel indicated by the SDF filter, as described. For example, for a given 5-tuple received from relay PGW/SGW 404, SDF filter parameter receiving component 510 can create a similar 5-tuple (e.g., reversing the source and destination information). SDF filtering component 512 can associate the similar 5-tuple to the radio bearer associated with the GTP tunnel. Thus, communicating component 508 can receive a packet from UE 110. SDF filtering component 512 can select a radio bearer over which to transmit the packet to donor eNB 102 based on the 5-tuple in a header of the packet. GTP/IP header assigning component 514 can associate a GTP and/or UDP/IP header to the packet, and communicating component 508 can transmit the packet to donor eNB 102 for providing to UE PGW/SGW 402 through relay PGW/SGW 404, as described.

Figure 7:
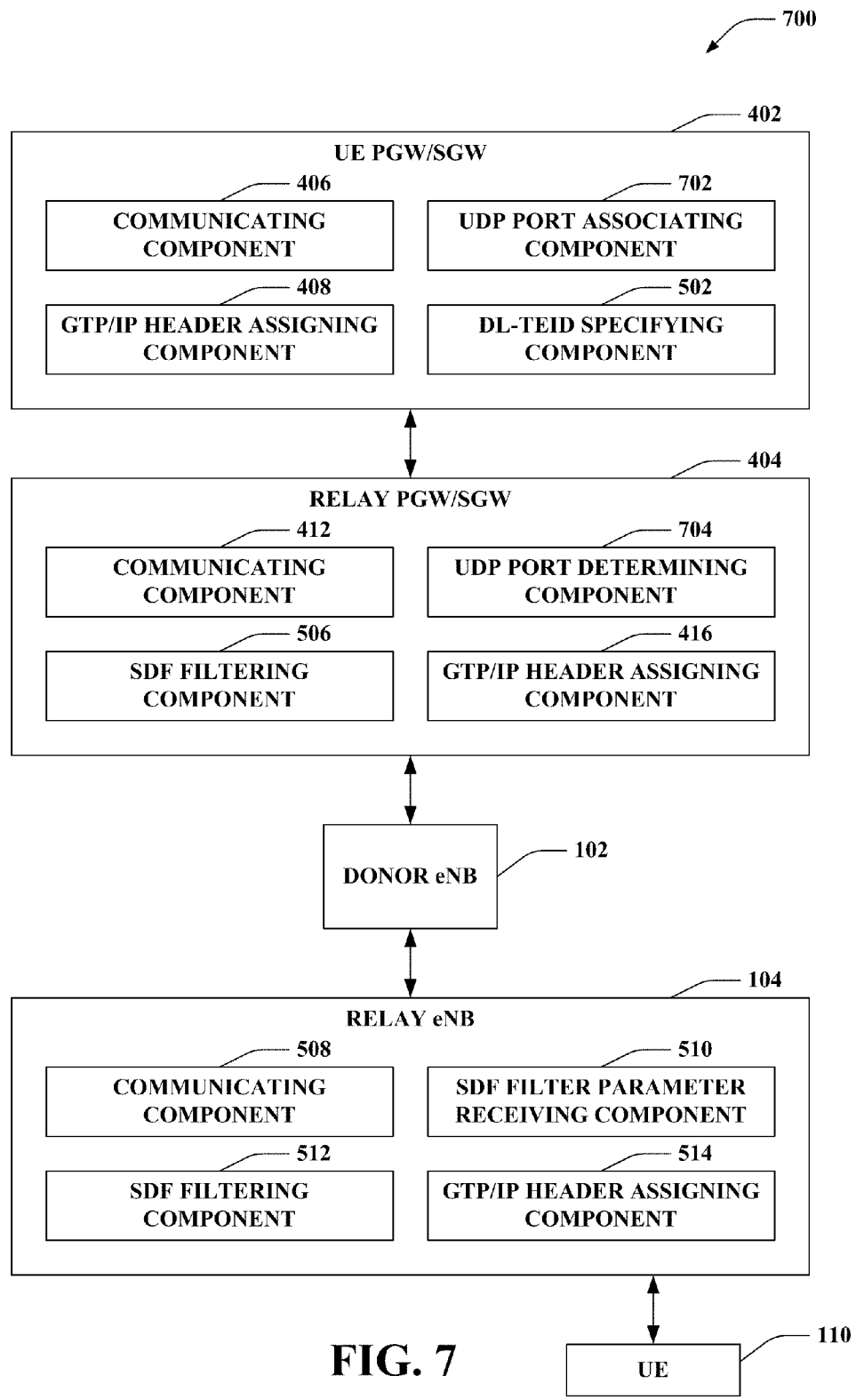
FIG. 7 is an illustration of an example wireless communications system that filters packets to a communication tunnel based at least in part on a user datagram protocol (UDP) port number.

FIG. 7 illustrates an example wireless communication system 700 that facilitates routing packets among multiple gateways for providing to devices in a wireless network using SDF filtering with varying UDP ports. System 700 includes a UE PGW/SGW 402 that provides IP layer communications to one or more UEs through one or more disparate components. In addition, system 700 includes a relay PGW/SGW 404 that similarly provides IP layer communications to one or more relay eNBs. System 700 includes a donor eNB 102 that provides relay eNB 104 (and/or other relay eNBs) with access to the PGW/SGWs 402 and 404 (as well as other components, in one example). Additionally, as described, relay eNB 104 can provide one or more additional relay eNBs and/or UEs, such as UE 110, with access to the PGW/SGWs 402 and 404 through the donor eNB 102. Moreover, donor eNB 102 can be a macrocell access point, femtocell access point, picocell access point, mobile base station, and/or the like. Relay eNB 104 can similarly be a mobile or stationary relay node that communicates with donor eNB 102 over a wireless or wired backhaul, as described.

UE PGW/SGW 402 comprises a communicating component 406 that can transmit data to, and/or receive data from, a relay PGW/SGW, MME, and/or one or more disparate network components to facilitate providing wireless network access over an IP layer and a UDP port associating component 702 that assigns a UDP port for providing a QoS at a disparate PGW/SGW. UE PGW/SGW 402 also includes a GTP/IP header assigning component 408 that can associate a GTP and/or UDP/IP header with communications to the relay PGW/SGW and/or one or more downstream network components for routing to a device indicated in the IP header and a DL-TEID specifying component 502 that can include a DL-TEID or other identifier received upon attachment of the device in the communications.

Relay PGW/SGW 404 includes a communicating component 412 that can transmit data to, and/or receive data from, a UE PGW/SGW, MME, a donor eNB, etc., and a UDP port determining component 704 that extracts a UDP port from communications with an upstream PGW/SGW for SDF filtering. Relay PGW/SGW 404 additionally includes an SDF filtering component 506 that can route the packet to a GTP tunnel based at least in part on the UDP port number and a GTP/IP header assigning component 418 that associates another GTP and/or UDP/IP header with the communications.

Relay PGW/SGW 404 includes a communicating component 412 that can transmit data to, and/or receive data from, a UE PGW/SGW, MME, a donor eNB, etc., and an SDF filter parameter receiving component 604 that obtains one or more parameters related to determining a QoS for one or more packets using an SDF filter (e.g., via communicating component 412 or otherwise). Relay PGW/SGW 404 additionally includes an SDF filtering component 506 that can route the packet to a GTP tunnel based at least in part on the SDF filter parameters and a GTP/IP header assigning component 418 that associates another GTP and/or UDP/IP header with the communications.

According to an example, as described, relay eNB 104 can establish one or more radio bearers with donor eNB 102 and can map disparate radio bearers established with one or more UEs to the radio bearers established with donor eNB 102. During establishment of a radio bearer between UE 110 and relay eNB 104 (e.g., during an attachment, bearer mapping, or similar procedure), UDP port associating component 702 can assign a UDP port number for providing a QoS for the radio bearer. UDP port associating component 702 can provide the UDP port assignment to one or more downstream nodes, such as relay PGW/SGW 404. UDP port determining component 704 can obtain the UDP port number from UE PGW/SGW 402, and SDF filtering component 506 can associate the port number to a tunnel (e.g., a GTP tunnel) with donor eNB 102 corresponding to a radio bearer between donor eNB 102 and relay eNB 104, as described. In another example, UDP port determining component 704 can obtain a 5-tuple comprising the UDP port number, and SDF filtering component 506 can associate the 5-tuple to the tunnel.

In this regard, communicating component 406 can subsequently obtain a downlink packet for UE 110 (e.g., by receiving the packet from an upstream network component, a disparate PGW/SGW, generating the packet, and/or the like), as described. GTP/IP header assigning component 408 can associate a GTP and/or UDP/IP header with the packet to facilitate routing the packet to UE 110. For example, the IP header can include an IP address for UE 110 assigned by UE PGW/SGW 402. In addition, DL-TEID specifying component 502 can include a DL-TEID related to UE 110 in the GTP header. As described, for example UE PGW/SGW 402 can receive the DL-TEID from the relay PGW/SGW 404, which can receive from the donor eNB 102, etc., as part of a bearer establishment status. Thus, the DL-TEID can more specifically relate to a radio bearer established between the relay eNB 104 and UE 110, as described above. In this regard, DL-TEID specifying component 502 can determine the DL-TEID for the packet based at least in part on an IP address in the packet (e.g., which can relate to UE 110), a type of the traffic, one or more identifiers specified in a related uplink packet, and/or the like.

In addition, UDP port associating component 702 can determine a UDP port number previously associated to UE 110 and/or a type of communication in the packet. In one example, this information can be received with the packet, determined similarly to (or based at least in part on) the DL-TEID, and/or the like. UDP port associating component 702 can specify the UDP port number in the IP header. Communicating component 406 can transmit the packet to relay PGW/SGW 404 (e.g., over a wired backhaul or similar core network connection). Communicating component 412 can receive the packet from UE PGW/SGW 402. UDP port determining component 704 can extract a UDP port number from the IP header associated to the packet by UE PGW/SGW 402 and can provide it to SDF filtering component 506 for associating the packet with a tunnel. In another example, SDF filtering component 506 can process a 5-tuple from the header of the IP packet, as described, and can associate the 5-tuple with the corresponding tunnel. In either case, GTP/IP header assigning component 418 can add a GTP and/or UDP/IP header to the packet to facilitate routing to donor eNB 102, as described, and communicating component 412 can transmit the packet to relay eNB 104 over the GTP tunnel through donor eNB 102.

In addition, for example, SDF filtering component 506 can further provide received SDF filter parameters comprising varying UDP port numbers to relay eNB 104 to facilitate similar filtering for uplink packets. SDF filter parameter receiving component 510 can obtain the parameters, and SDF filtering component 512 can filter packets received at communicating component 508 from UE 110 to donor eNB 102 over radio bearers related to UDP port numbers indicated in the SDF filter parameters for a given UE and/or related bearer with relay eNB 104. For example, SDF filtering component 512 can associate received UDP port numbers with related radio bearers between relay eNB 104 and UE 110. Thus, communicating component 508 can receive a packet from UE 110. SDF filtering component 512 can determine a UDP port number to specify when transmitting the packet to donor eNB 102 based on the UE 110 and/or a radio bearer over which the packet is received. GTP/IP header assigning component 514 can associate a GTP and/or UDP/IP header to the packet including the UDP port number, and communicating component 508 can transmit the packet to donor eNB 102 for providing to UE PGW/SGW 402 through relay PGW/SGW 404, as described.

Figure 8:
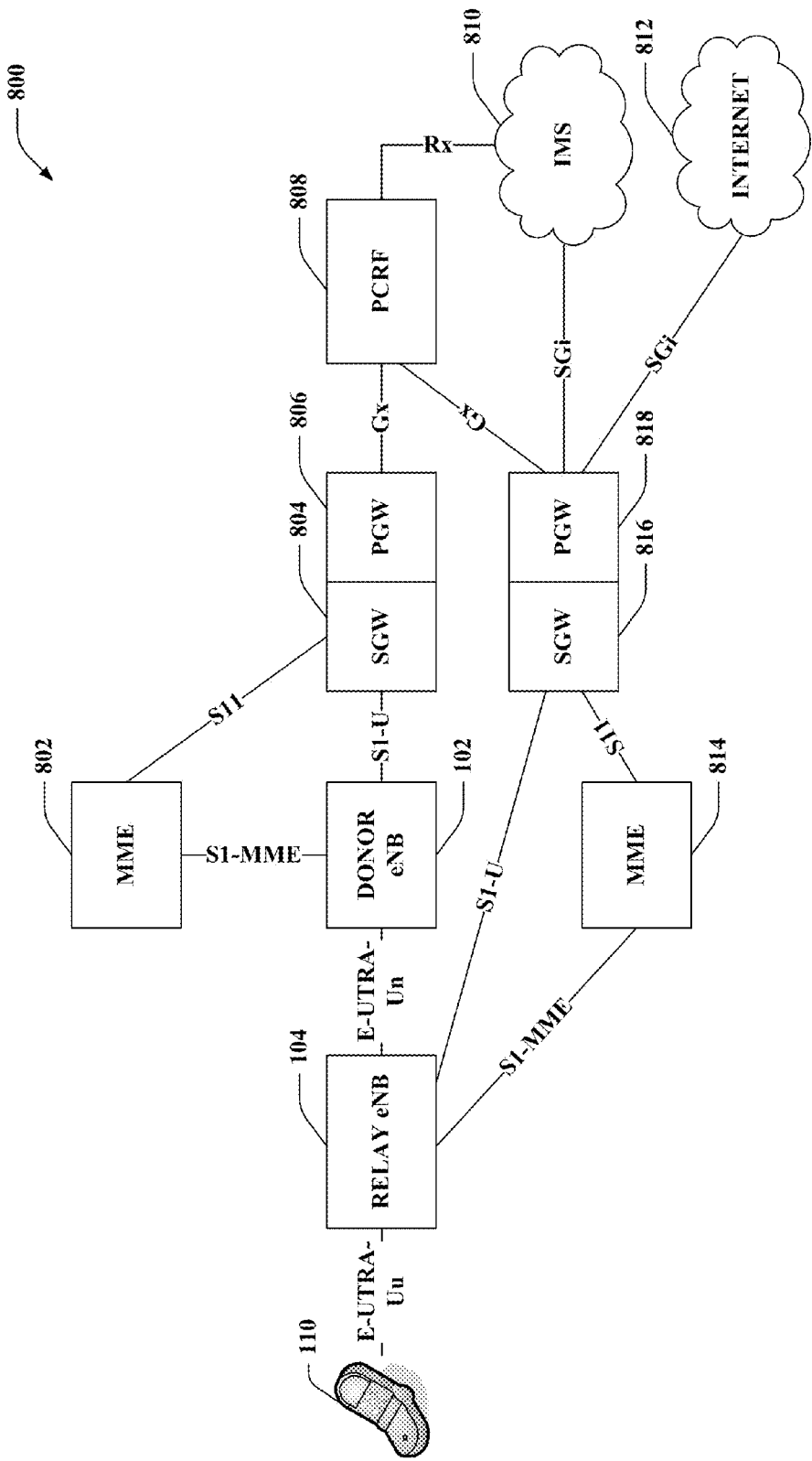
FIG. 8 is an illustration of an example wireless communications system that utilizes internet protocol (IP) relays to provide access to a wireless network.

Now turning to FIG. 8, an example wireless communication network 800 that provides IP relay functionality is depicted. Network 800 includes a UE 110 that communicates with a relay eNB 104, as described, to receive access to a wireless network. Relay eNB 104 can communicate with a donor eNB 102 to provide access to a wireless network, and as described, donor eNB 102 can communicate with an MME 802 and/or SGW 804 that relate to the relay eNB 104. SGW 804 can connect to or be coupled with a PGW 806, which provides network access to SGW 804 and/or additional SGWs. PGW 806 can communicate with a policy and charging rules function (PCRF) 808 to authenticate/authorize relay eNB 104 to use the network, which can utilize an IP multimedia subsystem (IMS) 810 to provide addressing to the relay eNB 104.

According to an example, SGW 804 and PGW 806 can also communicate with SGW 816 and PGW 818, which can be related to UE 110. For example, SGW 816 and/or PGW 818 can assign an IP address to UE 110 and can communicate therewith via SGW 804 and PGW 806, donor eNB 102, and relay eNB 104. As described above, communications between UE 110 and SGW 816 and/or PGW 818 can be tunneled through the nodes. SGW 804 and PGW 806 can similarly tunnel communications between UE 110 and MME 814. PGW 818 can similarly communicate with a PCRF 808 to authenticate/authorize UE 110, which can communicate with an IMS 810. In addition, PGW 818 can communicate directly with the IMS 810 and/or internet 812.

In an example, UE 110 can communicate with the relay eNB 104 over one or more radio protocol interfaces, such as an E-UTRA-Uu interface, as described, and the relay eNB 104 can communicate with the donor eNB 102 using one or more radio protocol interfaces, such as an E-UTRA-Un or other interface. As described, relay eNB 104 can add an UDP/IP and/or GTP header related to SGW 804 and/or PGW 806 to packets received from UE 110 and can forward the packets to donor eNB 102. Donor eNB 102 communicates with the MME 802 using an S1-MME interface and the SGW 804 and PGW 806 over an S1-U interface, as depicted. For example, donor eNB 102 can similarly add an UDP/IP and/or GTP header to the packets and forward to MME 802 or SGW 804.

SGW 804 and/or PGW 806 can utilize the UDP/IP and/or GTP headers to route the packets within the core network. For example, as described, SGW 804 and/or PGW 806 can receive the packets and remove the outer UDP/IP and/or GTP header, which relates to the SGW 804 and/or PGW 806. SGW 804 and/or PGW 806 can process the next UDP/IP and/or GTP header to determine a next node to receive the packets, which can be SGW 816 and/or PGW 818, which relate to UE 110. Similarly, SGW 816 and/or PGW 818 can obtain downlink packets related to UE and can include an UDP/IP header and/or GTP header related to communicating the packets to relay eNB 104 for providing to UE 110. SGW 816 and/or PGW 818 can forward the packets to SGW 804 and/or PGW 806, which relate to relay eNB 104. SGW 804 and/or PGW 806 can further include an additional UDP/IP and/or GTP header in the packets related to donor eNB 102.

Moreover, SGW 804 and/or PGW 806 can select a GTP tunnel over which to communicate the packets to donor eNB 102. This can be based on information in the UDP/IP and/or GTP headers received from SGW 816 and/or PGW 818, as described, and/or the like. SGW 804 and/or PGW 806 can communicate the packets to donor eNB 102 over the tunnel (e.g., by including one or more parameters in the GTP header included by SGW 804 and/or PGW 806). Donor eNB 102 can remove the outer GTP and/or UDP/IP header included by SGW 804 and/or PGW 806 and can determine a next node to receive the packets. Donor eNB 102 can thus transmit the packets to relay eNB 104 over a radio bearer related to the GTP tunnel Relay eNB 104 can similarly determine a next node to receive the packets and/or a bearer over which to transmit the packets based at least in part on one or more parameters in the next UDP/IP or GTP header, the radio bearer over which the packets are received, etc. Relay eNB 104 can remove the UDP/IP and GTP headers and can transmit the packets to UE 110.

Figure 9:
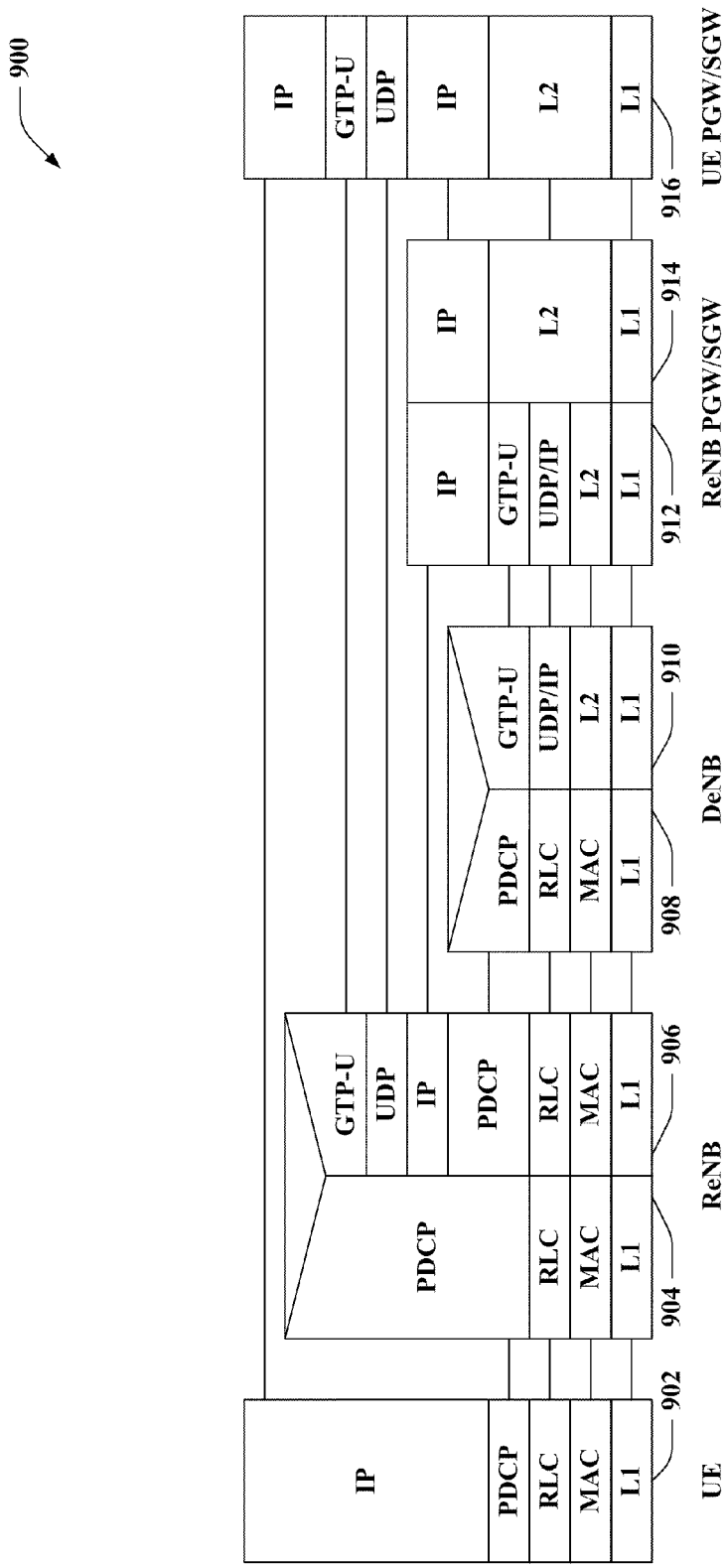
FIG. 9 is an illustration of example protocol stacks that facilitate providing IP relay functionality for device communications.

Referring to FIG. 9, example protocol stacks 900 are illustrated that facilitate communicating in a wireless network to provide IP relay functionality for data (e.g., user) plane communications. A UE protocol stack 902 is shown comprising an L1 layer, MAC layer, an RLC layer, a PDCP layer, and an IP layer. A relay eNB (ReNB) access link protocol stack 904 is depicted having an L1 layer, MAC layer, RLC layer, and PDCP layer, along with an ReNB backhaul link protocol stack 906 having an L1 layer, MAC layer, RLC layer, PDCP layer, IP layer, UDP layer, and GTP-U layer. A donor eNB (DeNB) access link protocol stack 908 is also shown having an L1 layer, MAC layer, RLC layer, and a PDCP layer, along with a DeNB backhaul link protocol stack 910 having an L1 layer, L2 layer, a UDP/IP layer, and a GTP-U. In addition, an ReNB PGW/SGW access link protocol stack 912 is shown having an L1 layer, L2 layer, UDP/IP layer, GTP-U layer, and IP layer, as well as a ReNB PGW/SGW backhaul link protocol stack 914 including an L1 layer, L2 layer, and IP layer. Moreover, a UE PGW/SGW protocol stack 916 is depicted having an L1 layer, L2, layer, IP layer related to ReNB PGW/SGW, UDP layer, GTP-U layer, and an IP layer related to a UE.

According to an uplink communication example, a UE can communicate with an ReNB for IP communications to a UE PGW/SGW. In this regard, UE can communicate over L1, MAC, RLC, and PDCP layers with the ReNB (e.g., using a EUTRA-Uu interface), as shown between protocol stacks 902 and 904. The UE can tunnel IP layer communications through the ReNB and other entities to the UE PGW/SGW, which assigns an IP address to the UE, as shown between protocol stacks 902 and 916. To facilitate such tunneling, the ReNB can insert an IP header to communicate access link packets to an ReNB PGW/SGW through one or more other nodes on the backhaul link, as shown between protocol stacks 906 and 912. In addition, ReNB inserts GTP-U and UDP headers related to the UE PGW/SGW, as shown between protocol stacks 906 and 916, to facilitate the tunneling.

Moreover, ReNB and can communicate with a DeNB over L1, MAC, RLC, and PDCP layers (e.g., using an EUTRA-Un interface), as shown between protocol stacks 906 and 908. The DeNB can remove the PDCP, RLC, and MAC layers, which facilitate air communications, and can subsequently communicate with ReNB PGW/SGW over L1, L2, UDP/IP, and GTP-U layers, as shown between protocol stacks 910 and 912. In this regard, DeNB can add the GTP-U and UDP/IP layers related to ReNB the PGW/SGW to tunnel the GTP-U, UDP, and IP layers of the ReNB to the ReNB PGW/SGW. ReNB PGW/SGW can remove the GTP-U and UDP/IP layers, and can subsequently communicate with UE PGW/SGW over L1, L2, and IP layers to tunnel IP communications from UE, as described. It is to be appreciated that similar procedures can be utilized to tunnel downlink packets from the UE PGW/SGW to the UE.

Referring to FIGS. 10-15, methodologies relating to routing packets using IP relays are illustrated. While, for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 10:
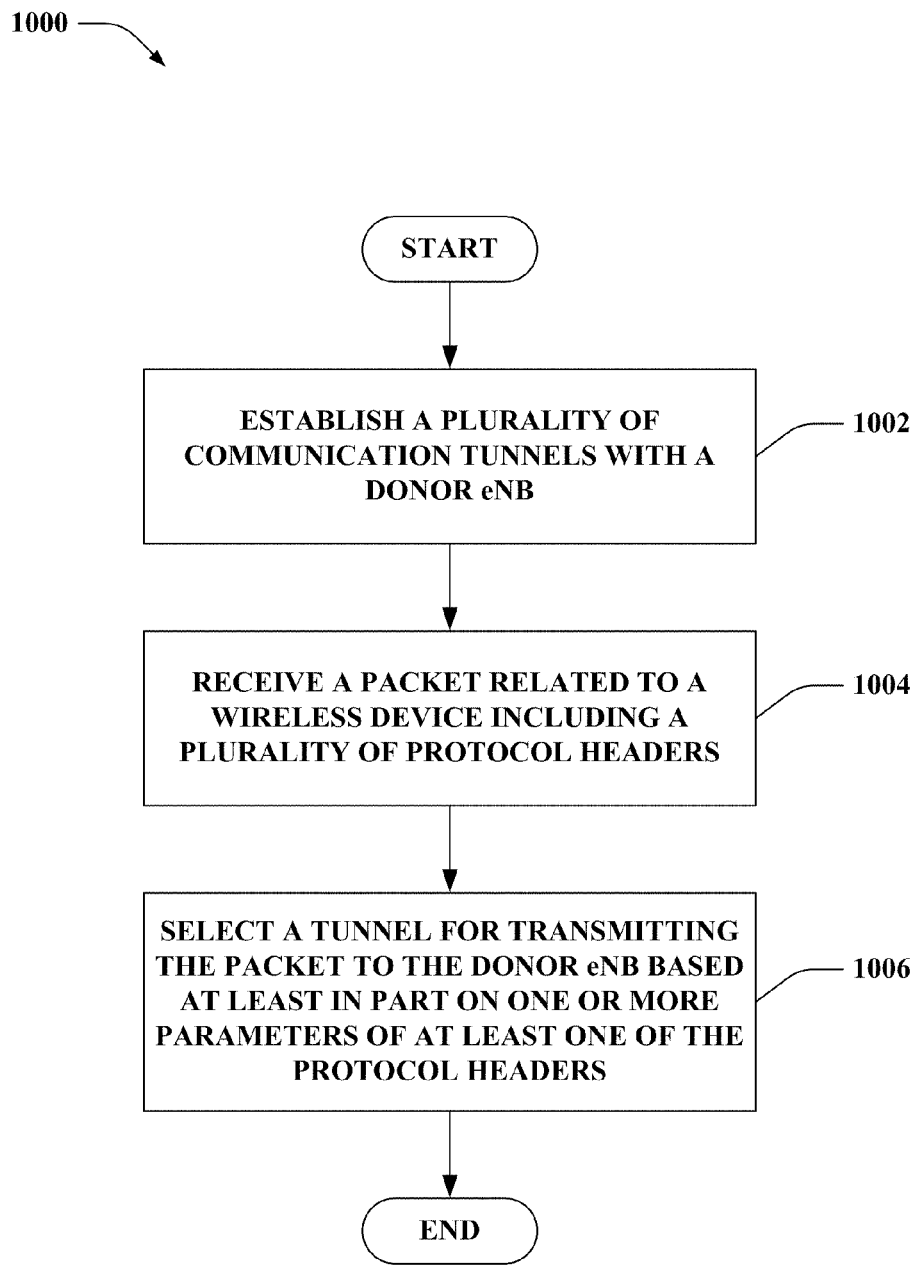
FIG. 10 is an illustration of an example methodology for selecting a communication tunnel for a packet based on one or more protocol header parameters.

Turning to FIG. 10, an example methodology 1000 that facilitates selecting a tunnel for transmitting packets to a donor eNB is illustrated. At 1002, a plurality of communication tunnels can be established with a donor eNB. For example, the communication tunnels can each relate to a radio bearer established between the donor eNB and a relay eNB, as described. At 1004, a packet related to a wireless device can be received including a plurality of protocol headers. As described, the packet can include an IP and/or GTP header from one or more upstream network components. At 1006, a tunnel can be selected for transmitting the packet to the donor eNB based at least in part on one or more parameters of at least one of the protocol headers. As described, for example, the tunnel can be selected based at least in part on a DSCP value in an IP header of the packet. In another example, the tunnel can be selected based on an SDF filter that can process a 6-tuple generated from one or more parameters of one or more IP and GTP headers, a 5-tuple from an inner-most IP header, a specified UDP port number, and/or the like. In addition, in an example, the tunnel can be selected based at least in part on a destination IP address specified in the packet (e.g., where multiple IP addresses are allocated for different QoS, as described).

Figure 11:
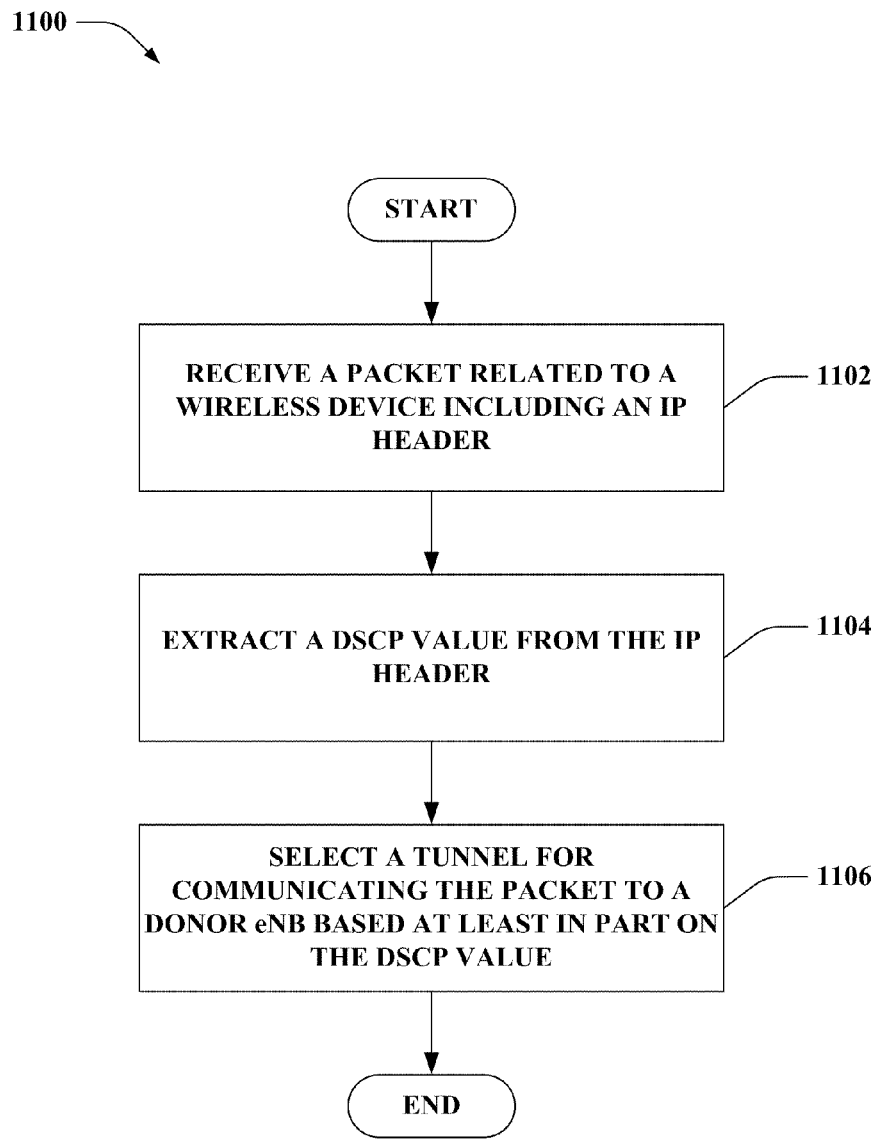
FIG. 11 is an illustration of an example methodology that selects a communication tunnel for a packet based on an IP header parameter value.

Referring to FIG. 11, an example methodology 1100 is depicted that facilitates selecting a communication tunnel for transmitting a packet to a donor eNB based on a DSCP value. At 1102, a packet related to a wireless device can be received including an IP header. A DSCP value can be extracted from the IP header at 1104. At 1106, a tunnel can be selected for communicating the packet to a donor eNB based at least in part on the DSCP value. As described, the DSCP value (and/or a range of DSCP values) can be associated to a plurality of tunnels that correspond to radio bearers between the donor eNB and a relay eNB. Thus, according to the DSCP value, a tunnel can be selected for transmitting the packet that relates to a radio bearer to provide a QoS for the packet.

Figure 12:
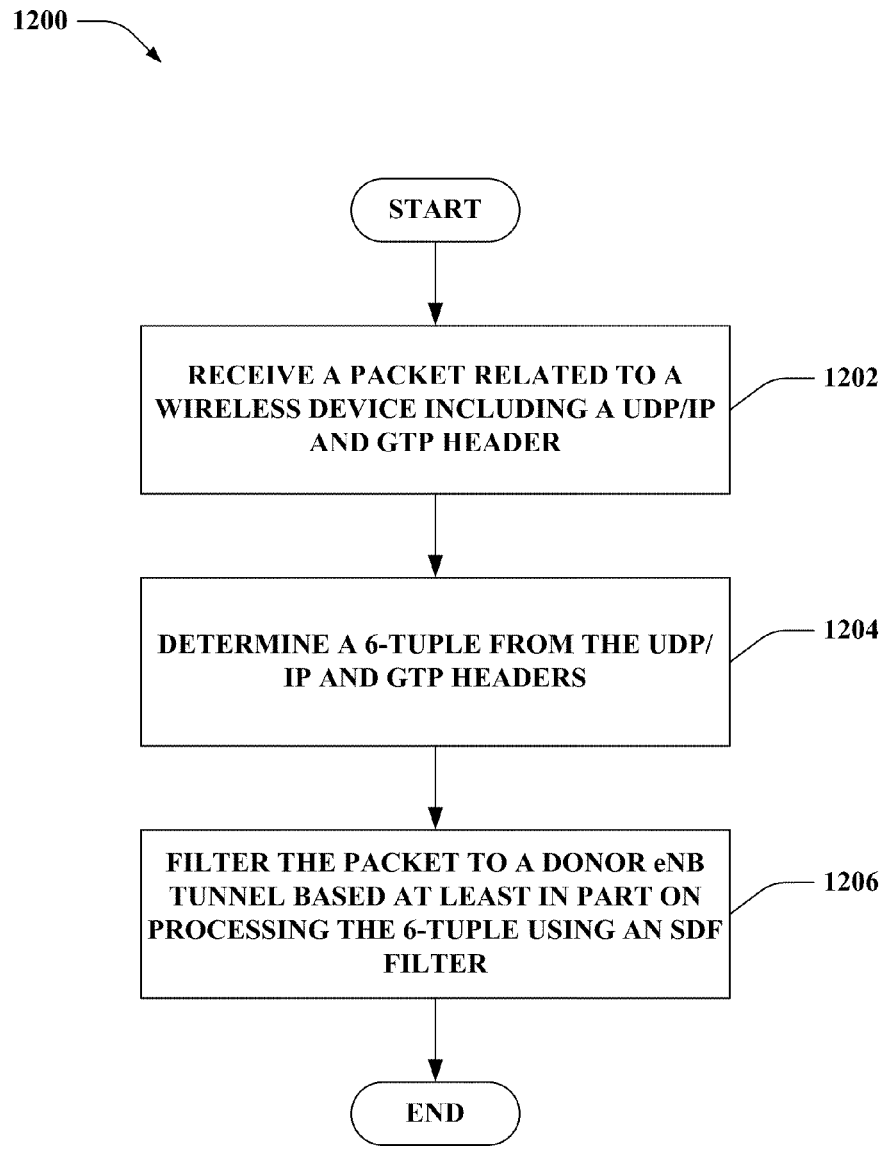
FIG. 12 is an illustration of an example methodology that determines a communication tunnel for a packet based at least in part on a 6-tuple.

Turning to FIG. 12, an example methodology 1200 that facilitates filtering packets based on 6-tuples of received header parameters is illustrated. At 1202, a packet related to a wireless device can be received including a UDP/IP and GTP header. At 1204, a 6-tuple can be determined from the UDP/IP and GTP headers. For example, the 6-tuple can include a source IP address, destination IP address, source port number, destination port number, protocol, and DL-TEID. At 1206, the packet can be filtered to a donor eNB tunnel based at least in part on processing the 6-tuple using an SDF filter. In this regard, as described, the 6-tuple can be previously associated to the tunnel based at least in part on receiving the 6-tuple (e.g., upon bearer establishment between a relay eNB and UE related to the DL-TEID), and a PCC rule can be defined for the SDF filter for processing 6-tuples, for example.

Figure 13:
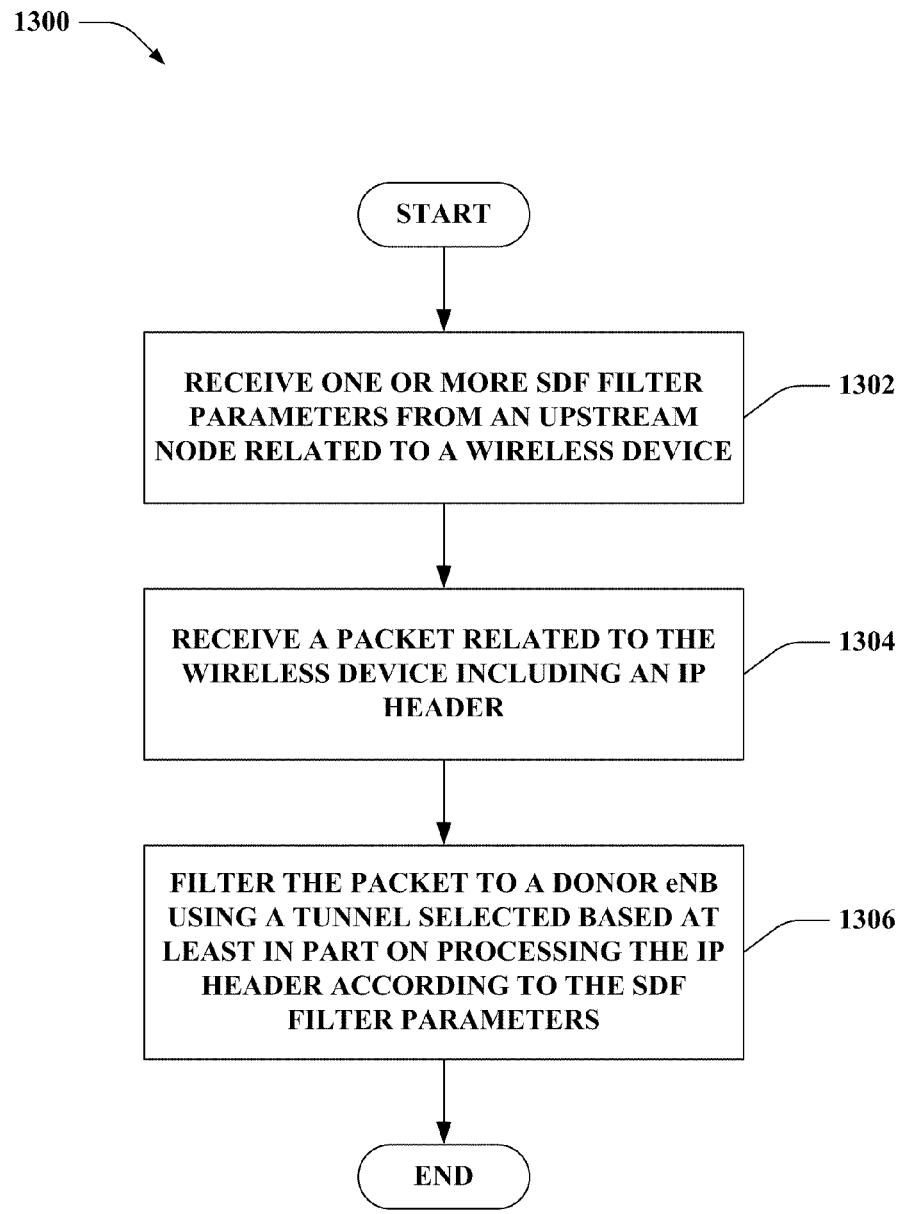
FIG. 13 is an illustration of an example methodology that filters packets to a communication tunnel based on an IP header.

Referring to FIG. 13, an example methodology 1300 is shown that facilitates filtering a packet to a donor eNB based on processing an IP header of the packet. At 1302, one or more SDF filter parameters can be received from an upstream node related to a wireless device. For example, the SDF filter parameters can include IP/UDP parameters of the wireless device. At 1304, a packet related to the wireless device can be received including an IP header. As described, for example, the packet can include multiple IP headers. At 1306, the packet can be filtered to a donor eNB using a tunnel selected based at least in part on processing the IP header according to the SDF filter parameters. In this regard, the processed IP header can be the inner-most IP header of the packet, which includes UDP/IP information related to the wireless device.

Figure 14:
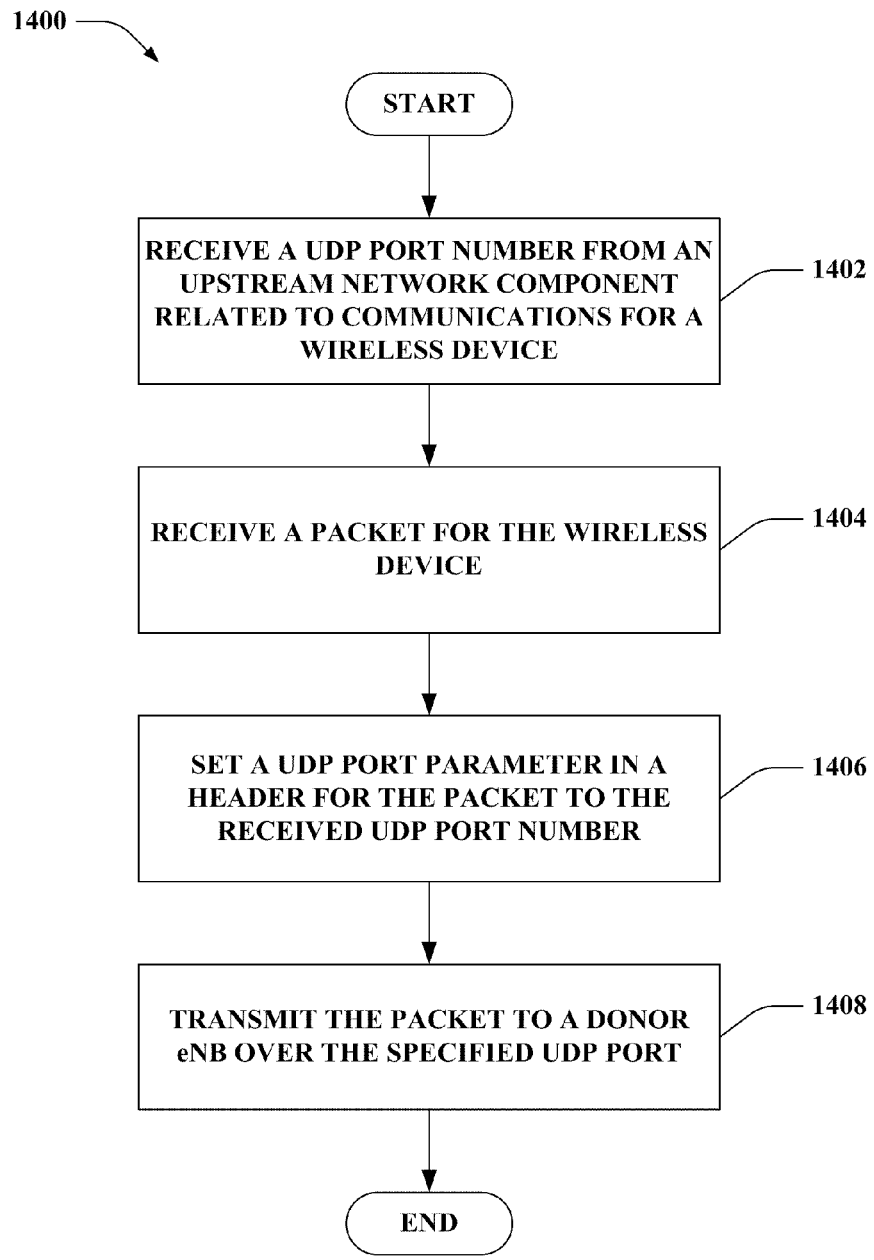
FIG. 14 is an illustration of an example methodology that filters packets to a communication tunnel based at least in part on a UDP port number.

Turning to FIG. 14, an example methodology 1400 that facilitates filtering packets through a donor eNB by using disparate UDP port numbers is illustrated. At 1402, a UDP port number related to communications for a wireless device can be received from an upstream network component. At 1404, a packet can be received for the wireless device. In one example, the UDP port number can be present in a header of the packet and can be determined therefrom. At 1406, a UDP port parameter in the header for the packet can be set to the received UDP port number. At 1408, the packet can be transmitted to a donor eNB over the specified UDP port. As described, the donor eNB can then transmit the packet to a relay eNB over a radio bearer related to the UDP port to provide QoS for the packet.

Figure 15:
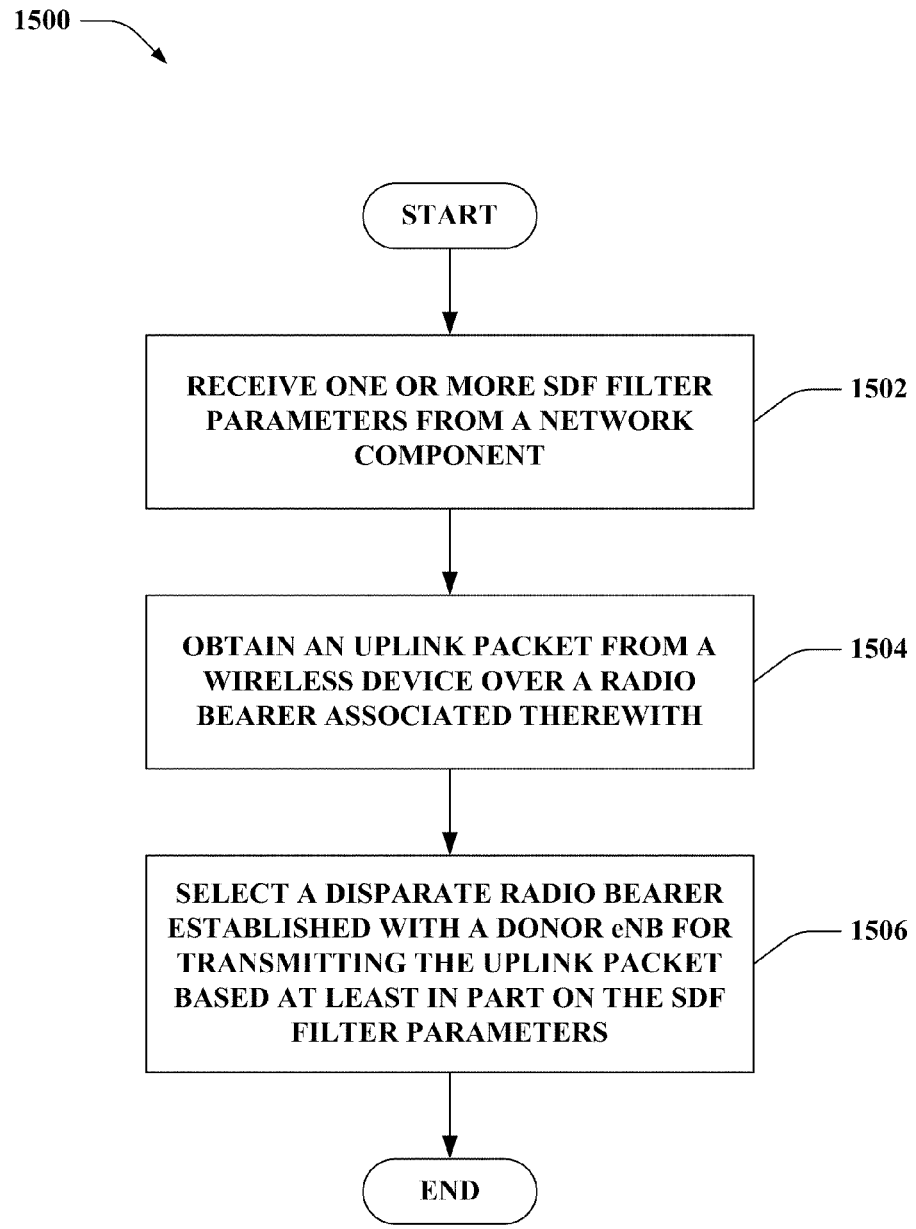
FIG. 15 is an illustration of an example methodology that filters packets to a radio bearer based on one or more received service data flow (SDF) parameters.

Referring to FIG. 15, an example methodology 1500 is shown that facilitates selecting a radio bearer for communicating a packet to a donor eNB based at least in part on one or more received SDF parameters. At 1502, one or more SDF filter parameters can be received from a network component. As described, the parameters can relate to an n-tuple for processing packet headers according to an SDF filter, associated radio bearers or related tunnels that correspond to the n-tuple at the network component, UDP port numbers, and/or the like. At 1504, an uplink packet can be obtained from a wireless device over a radio bearer associated therewith. At 1506, a disparate radio bearer established with a donor eNB can be selected for transmitting the uplink packet based at least in part on the SDF filter parameters. As described, this can include matching an n-tuple in the uplink packet (with or without one or more additional determined parameters) to an n-tuple in the SDF filter parameters to determine the radio bearer, specifying a UDP port number that corresponds to a given radio bearer, and/or the like. In this regard, QoS can be similarly provided for uplink packets.

It will be appreciated that, in accordance with one or more aspects described herein, inferences can be made regarding mapping tunnels to radio bearers, determining a QoS for packets received over a radio bearer or from a core network component, and/or other aspects described herein. As used herein, the term to "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Figure 16:
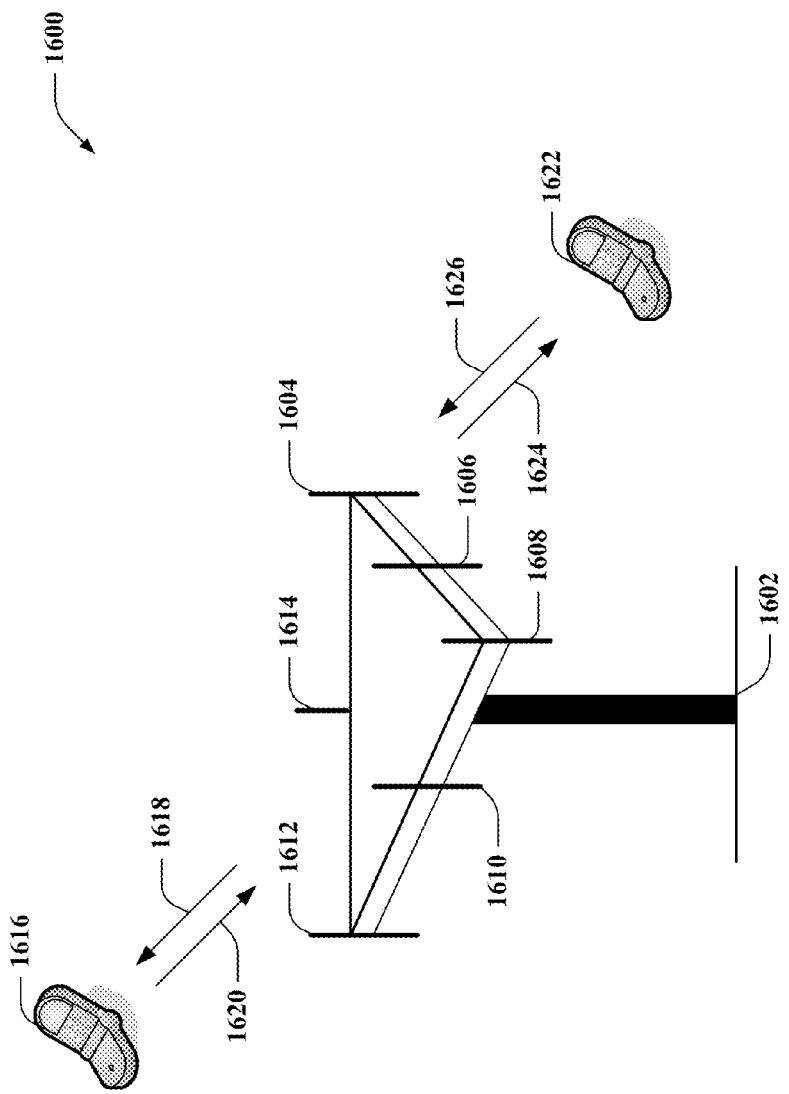
FIG. 16 is an illustration of a wireless communication system in accordance with various aspects set forth herein.

Referring now to FIG. 16, a wireless communication system 1600 is illustrated in accordance with various embodiments presented herein. System 1600 comprises a base station 1602 that can include multiple antenna groups. For example, one antenna group can include antennas 1604 and 1606, another group can comprise antennas 1608 and 1610, and an additional group can include antennas 1612 and 1614. Two antennas are illustrated for each antenna group; however, more or fewer antennas can be utilized for each group. Base station 1602 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 1602 can communicate with one or more mobile devices such as mobile device 1616 and mobile device 1622; however, it is to be appreciated that base station 1602 can communicate with substantially any number of mobile devices similar to mobile devices 1616 and 1622. Mobile devices 1616 and 1622 can be, for example, cellular phones, smart phones, laptops, handheld communication devices, handheld computing devices, satellite radios, global positioning systems, PDAs, and/or any other suitable device for communicating over wireless communication system 1600. As depicted, mobile device 1616 is in communication with antennas 1612 and 1614, where antennas 1612 and 1614 transmit information to mobile device 1616 over a forward link 1618 and receive information from mobile device 1616 over a reverse link 1620. Moreover, mobile device 1622 is in communication with antennas 1604 and 1606, where antennas 1604 and 1606 transmit information to mobile device 1622 over a forward link 1624 and receive information from mobile device 1622 over a reverse link 1626. In a frequency division duplex (FDD) system, forward link 1618 can utilize a different frequency band than that used by reverse link 1620, and forward link 1624 can employ a different frequency band than that employed by reverse link 1626, for example. Further, in a time division duplex (TDD) system, forward link 1618 and reverse link 1620 can utilize a common frequency band and forward link 1624 and reverse link 1626 can utilize a common frequency band.

Each group of antennas and/or the area in which they are designated to communicate can be referred to as a sector of base station 1602. For example, antenna groups can be designed to communicate to mobile devices in a sector of the areas covered by base station 1602. In communication over forward links 1618 and 1624, the transmitting antennas of base station 1602 can utilize beamforming to improve signal-to-noise ratio of forward links 1618 and 1624 for mobile devices 1616 and 1622. Also, while base station 1602 utilizes beamforming to transmit to mobile devices 1616 and 1622 scattered randomly through an associated coverage, mobile devices in neighboring cells can be subject to less interference as compared to a base station transmitting through a single antenna to all its mobile devices. Moreover, mobile devices 1616 and 1622 can communicate directly with one another using a peer-to-peer or ad hoc technology (not shown).

According to an example, system 1600 can be a multiple-input multiple-output (MIMO) communication system. Further, system 1600 can utilize substantially any type of duplexing technique to divide communication channels (e.g., forward link, reverse link, . . . ) such as FDD, FDM, TDD, TDM, CDM, and the like. In addition, communication channels can be orthogonalized to allow simultaneous communication with multiple devices over the channels; in one example, OFDM can be utilized in this regard. Thus, the channels can be divided into portions of frequency over a period of time. In addition, frames can be defined as the portions of frequency over a collection of time periods; thus, for example, a frame can comprise a number of OFDM symbols. The base station 1602 can communicate to the mobile devices 1616 and 1622 over the channels, which can be create for various types of data. For example, channels can be created for communicating various types of general communication data, control data (e.g., quality information for other channels, acknowledgement indicators for data received over channels, interference information, reference signals, etc.), and/or the like.

Figure 17:
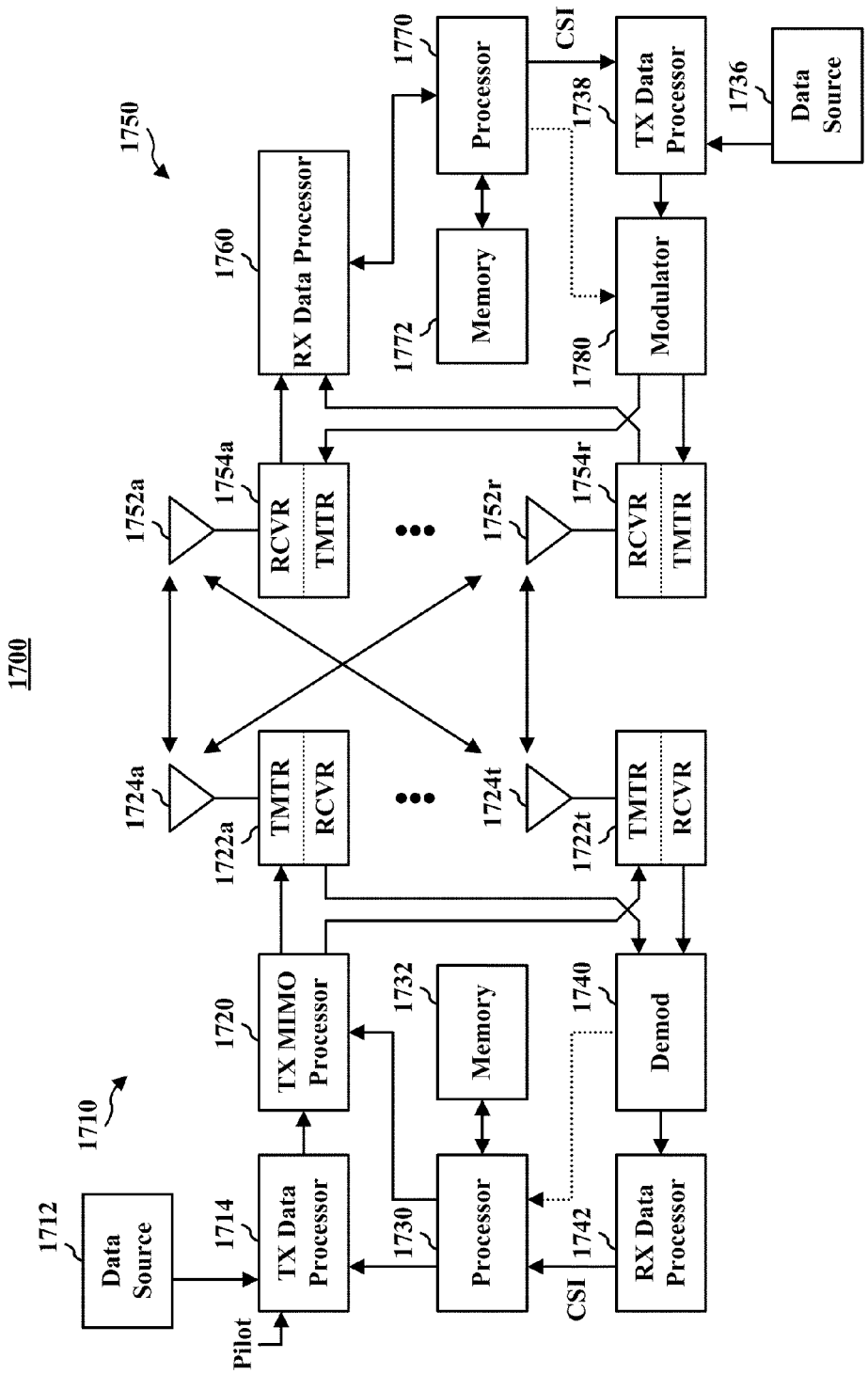
FIG. 17 is an illustration of an example wireless network environment that can be employed in conjunction with the various systems and methods described herein.

FIG. 17 shows an example wireless communication system 1700. The wireless communication system 1700 depicts one base station 1710 and one mobile device 1750 for sake of brevity. However, it is to be appreciated that system 1700 can include more than one base station and/or more than one mobile device, wherein additional base stations and/or mobile devices can be substantially similar or different from example base station 1710 and mobile device 1750 described below. In addition, it is to be appreciated that base station 1710 and/or mobile device 1750 can employ the systems (FIGS. 1-8 and 16), protocol stacks (FIG. 9) and/or methods (FIGS. 10-15) described herein to facilitate wireless communication therebetween.

At base station 1710, traffic data for a number of data streams is provided from a data source 1712 to a transmit (TX) data processor 1714. According to an example, each data stream can be transmitted over a respective antenna. TX data processor 1714 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at mobile device 1750 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 1730.

The modulation symbols for the data streams can be provided to a TX MIMO processor 1720, which can further process the modulation symbols (e.g., for OFDM). TX MIMO processor 1720 then provides $N_T$ modulation symbol streams to $N_T$ transmitters (TMTR) 1722a through 1722t. In various aspects, TX MIMO processor 1720 applies beamforming weights to the symbols of the data streams and to the antenna from which the symbol is being transmitted.

Each transmitter 1722 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 1722a through 1722t are transmitted from $N_T$ antennas 1724a through 1724t, respectively.

At mobile device 1750, the transmitted modulated signals are received by $N_R$ antennas 1752a through 1752r and the received signal from each antenna 1752 is provided to a respective receiver (RCVR) 1754a through 1754r. Each receiver 1754 conditions (e.g., filters, amplifies, and downconverts) a respective signal, digitizes the conditioned signal to provide samples, and further processes the samples to provide a corresponding "received" symbol stream.

An RX data processor 1760 can receive and process the $N_R$ received symbol streams from $N_R$ receivers 1754 based on a particular receiver processing technique to provide $N_T$ "detected" symbol streams. RX data processor 1760 can demodulate, deinterleave, and decode each detected symbol stream to recover the traffic data for the data stream. The processing by RX data processor 1760 is complementary to that performed by TX MIMO processor 1720 and TX data processor 1714 at base station 1710.

A processor 1770 can periodically determine which precoding matrix to utilize as discussed above. Further, processor 1770 can formulate a reverse link message comprising a matrix index portion and a rank value portion.

The reverse link message can comprise various types of information regarding the communication link and/or the received data stream. The reverse link message can be processed by a TX data processor 1738, which also receives traffic data for a number of data streams from a data source 1736, modulated by a modulator 1780, conditioned by transmitters 1754a through 1754r, and transmitted back to base station 1710.

At base station 1710, the modulated signals from mobile device 1750 are received by antennas 1724, conditioned by receivers 1722, demodulated by a demodulator 1740, and processed by a RX data processor 1742 to extract the reverse link message transmitted by mobile device 1750. Further, processor 1730 can process the extracted message to determine which precoding matrix to use for determining the beamforming weights.

Processors 1730 and 1770 can direct (e.g., control, coordinate, manage, etc.) operation at base station 1710 and mobile device 1750, respectively. Respective processors 1730 and 1770 can be associated with memory 1732 and 1772 that store program codes and data. Processors 1730 and 1770 can also perform computations to derive frequency and impulse response estimates for the uplink and downlink, respectively.

Figure 18:
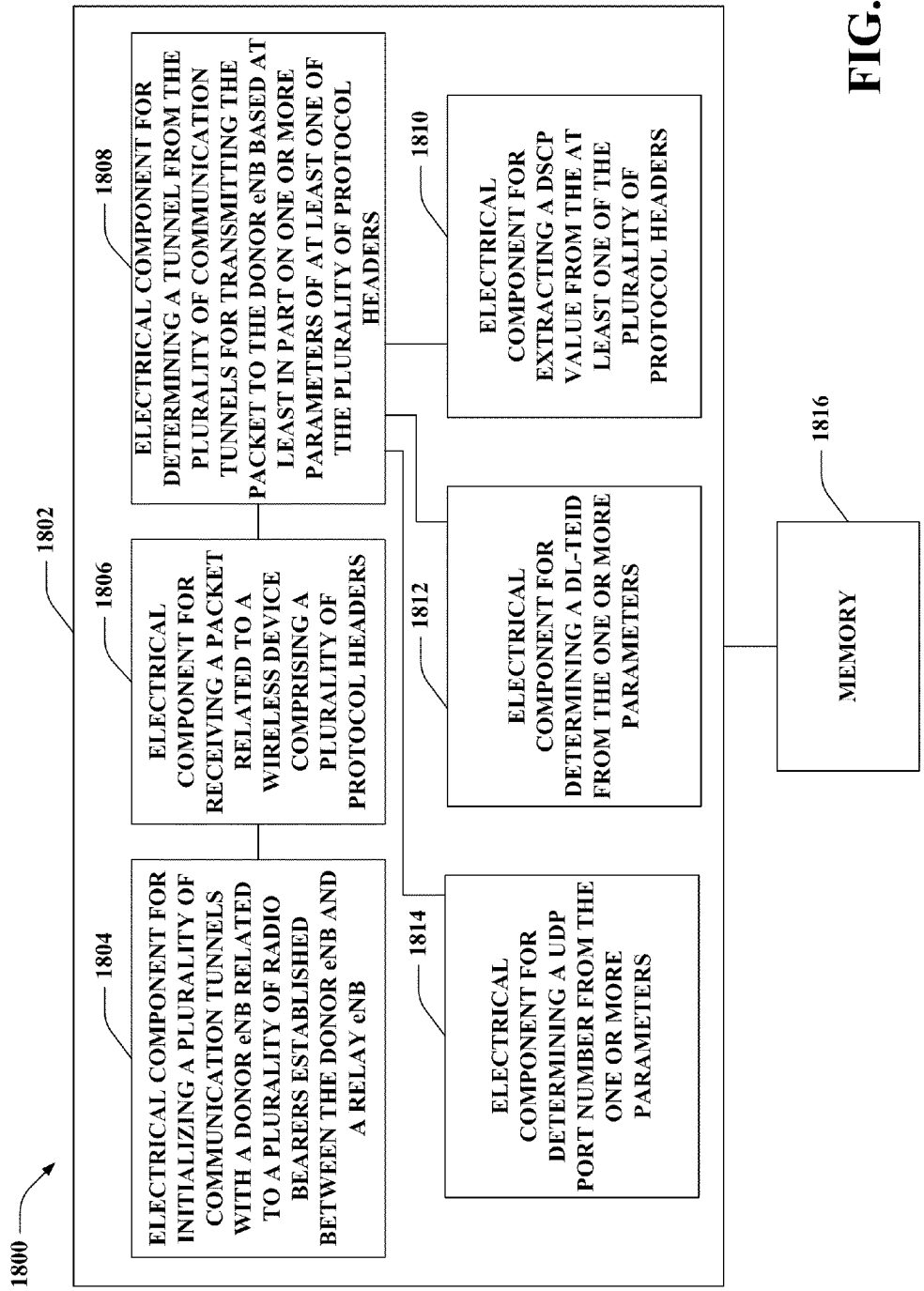
FIG. 18 is an illustration of an example system that selects a communication tunnel for a packet based on one or more protocol header parameters.

With reference to FIG. 18, illustrated is a system 1800 that facilitates selecting tunnels for communicating packets from an upstream network component to a donor eNB. For example, system 1800 can reside at least partially within a base station, mobile device, etc. It is to be appreciated that system 1800 is represented as including functional blocks, which can be functional blocks that represent functions implemented by a processor, software, or combination thereof (e.g., firmware). System 1800 includes a logical grouping 1802 of electrical components that can act in conjunction. For instance, logical grouping 1802 can include an electrical component for initializing a plurality of communication tunnels with a donor eNB related to a plurality of radio bearers established between the donor eNB and a relay eNB 1804. For example, as described, the communications tunnels can be GTP tunnels that correspond to a radio bearer to provide a QoS. Additionally, logical grouping 1802 can include an electrical component for receiving a packet related to a wireless device comprising a plurality of protocol headers 1806.

The headers can include one or more UDP/IP or GTP headers that indicate source, destination, tunneling and/or other information. Moreover, logical grouping 1802 can include an electrical component for determining a tunnel from the plurality of communication tunnels for transmitting the packet to the donor eNB based at least in part on one or more parameters of at least one of the plurality of protocol headers 1808. Thus, as described, a tunnel can be determined based at least in part on a DSCP value in the IP header. In another example, the tunnel can be determined based at least in part on applying an SDF filter to one or more parameters of the at least one header. In an example, the one or more parameters can correspond to a n-tuple, as described, a UDP port number, etc. In yet another example, electrical component 1808 can process the inner-most IP header to obtain the parameters.

Thus, in addition, logical grouping 1802 can include an electrical component for extracting a DSCP value from the at least one of the plurality of protocol headers 1810. This can be an IP header, as described. Moreover, logical grouping 1802 can include an electrical component for determining a DL-TEID from the one or more parameters 1812. This can be included as part of a 6-tuple for processing by the SDF filter, as described. Further, logical grouping 1802 can include an electrical component for determining a UDP port number from the one or more parameters 1814. In this regard, the packet can be transmitted to the donor eNB based on the UDP port number to provide QoS. Additionally, system 1800 can include a memory 1816 that retains instructions for executing functions associated with electrical components 1804, 1806, 1808, 1810, 1812, and 1814. While shown as being external to memory 1816, it is to be understood that one or more of electrical components 1804, 1806, 1808, 1810, 1812, and 1814 can exist within memory 1816.

Figure 19:
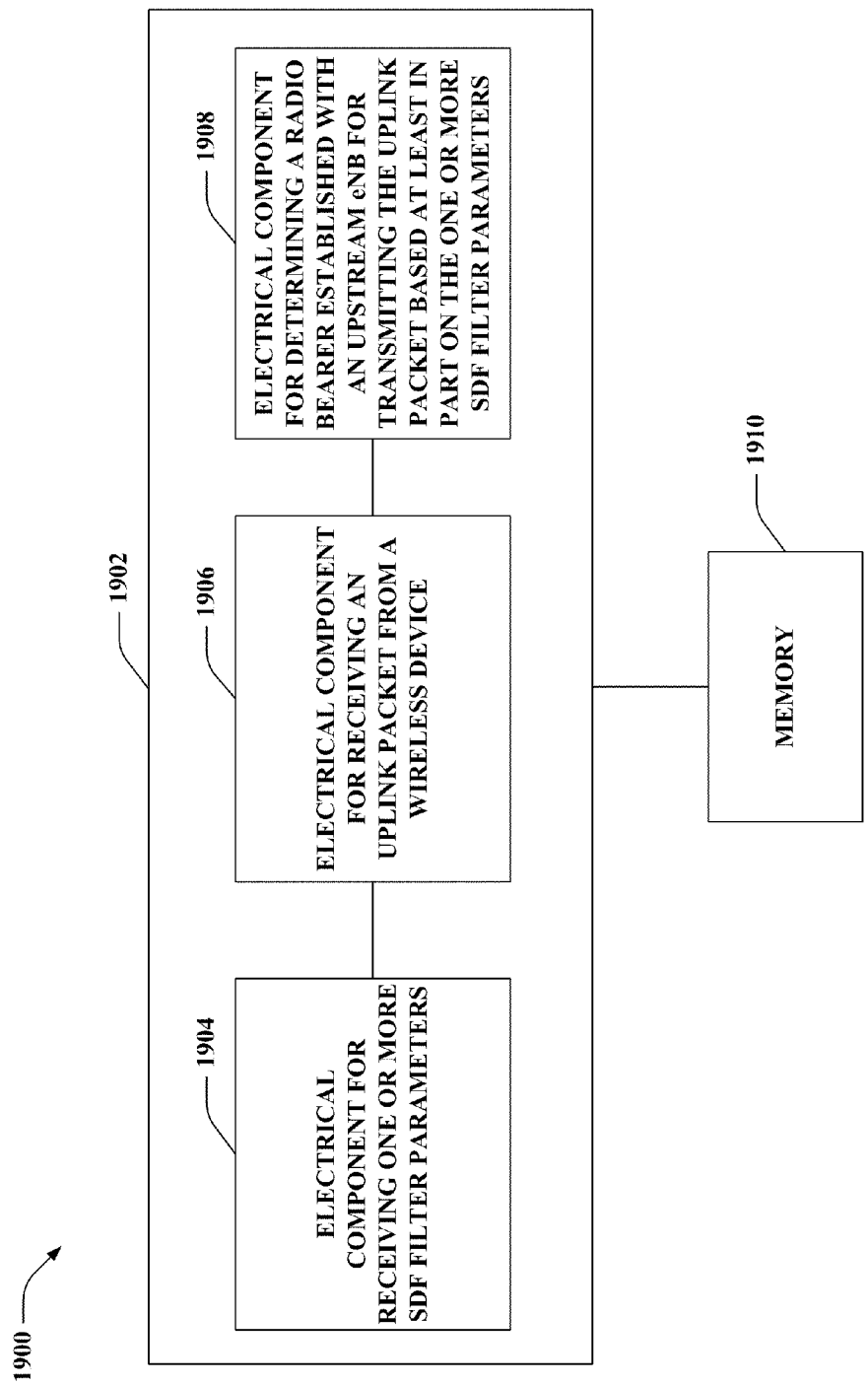
FIG. 19 is an illustration of an example system that filters packets to a radio bearer based on one or more received SDF parameters.

With reference to FIG. 19, illustrated is a system 1900 that facilitates selecting radio bearers for transmitting uplink packets according to received SDF filter parameters. For example, system 1900 can reside at least partially within a base station, mobile device, etc. It is to be appreciated that system 1900 is represented as including functional blocks, which can be functional blocks that represent functions implemented by a processor, software, or combination thereof (e.g., firmware). System 1900 includes a logical grouping 1902 of electrical components that can act in conjunction. For instance, logical grouping 1902 can include an electrical component for receiving one or more SDF filter parameters 1904. As described, the SDF filter parameters can relate to n-tuples and related tunnels or radio bearers at an upstream eNB as determined by an upstream network component to provide a QoS. The n-tuple, as described, can correspond to a wireless device and/or a related radio bearer. In another example, the SDF filter parameters can also relate to a UDP port for transmitting the uplink packets.

Additionally, logical grouping 1902 can include an electrical component for receiving an uplink packet from a wireless device 1906. Moreover, logical grouping 1902 can include an electrical component for determining a radio bearer established with an upstream eNB for transmitting the uplink packet based at least in part on the one or more SDF parameters 1908. As described, electrical component 1908 can determine the radio bearer based at least in part on matching one or more parameters of a header of the uplink packet with the SDF filter parameters to discern a tunnel or the related radio bearer. In addition, in another example, electrical component 1908 can utilize a corresponding UDP port number to communicate the packet to the upstream eNB. Additionally, system 1900 can include a memory 1910 that retains instructions for executing functions associated with electrical components 1904, 1906, and 1908. While shown as being external to memory 1910, it is to be understood that one or more of electrical components 1904, 1906, and 1908 can exist within memory 1910.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions, procedures, etc. may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Furthermore, to the extent that the term "includes" is used in either the detailed description or the claims, such term is intended to be inclusive in a manner similar to the term "comprising" as "comprising" is interpreted when employed as a transitional word in a claim. Furthermore, although elements of the described aspects and/or aspects may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method, comprising:
    establishing a plurality of communication tunnels between a core wireless network component and a donor evolved Node B (eNB), each related to one of a plurality of radio bearers between the donor eNB and a relay NB;
    associating each of the plurality of communication tunnels with a service data flow (SDF);
    receiving a packet related to a wireless device including a plurality of protocol headers;
    selecting a tunnel from the plurality of communication tunnels for transmitting the packet to the donor eNB based at least in part on one or more parameters of at least one of the plurality of protocol headers, wherein the selecting the tunnel from the plurality of communication tunnels includes determining an SDF for the packet according to an SDF filter based at least in part on the one or more parameters of the at least one of the plurality of protocol headers, and wherein the SDF corresponds to the tunnel.

2. The method of claim 1, wherein the one or more parameters of the at least one of the plurality of protocol headers is a differentiated services code point (DSCP) value, and the selecting the tunnel from the plurality of communication tunnels is based at least in part on associating the DSCP value to the tunnel.

3. The method of claim 2, further comprising mapping a range of DSCP values to at least a portion of the plurality of communication tunnels.

4. The method of claim 3, wherein the mapping the range of DSCP values to at least the portion of the plurality of communication tunnels is based at least in part on quality of service (QoS) requirements associated with the range of DSCP values and QoS associated with the one of the plurality of radio bearers related to each communication tunnel in the portion of the plurality of communication tunnels.

5. The method of claim 1, wherein the at least one of the plurality of protocol headers is a general packet radio service (GPRS) tunneling protocol (GTP) header, the determining the SDF for the packet includes obtaining a downlink tunnel endpoint identifier (DL-TEID) from the at least one of the plurality of protocol headers according to a policy and charging control rule, and determining the SDF according to the SDF filter based at least in part on the DL-TEID.

6. The method of claim 5, further comprising receiving the DL-TEID as part of a bearer establishment procedure between the wireless device and the relay eNB.

7. The method of claim 1, wherein the at least one of the plurality of protocol headers is an inner-most internet protocol (IP) header in the packet.

8. The method of claim 7, further comprising:
receiving the one or more parameters of the inner-most IP header as parameters for the SDF filter; and
associating the one or more parameters to the tunnel.

9. The method of claim 1, wherein the one or more parameters is a user datagram protocol (UDP) port number.

10. The method of claim 9, further comprising:
receiving the UDP port number during establishment of a radio bearer between the wireless device and the relay eNB; and
associating the UDP port number to the tunnel.

11. The method of claim 1, further comprising receiving a disparate packet including the plurality of protocol headers from an upstream gateway over a connection related to an internet protocol (IP) address, wherein the receiving the packet includes receiving the packet from the upstream gateway over a disparate connection related to a disparate IP address.

12. The method of claim 11, further comprising selecting a disparate tunnel from the plurality of communication tunnels for transmitting the disparate packet based at least in part on the receiving the disparate packet over the connection.

13. An apparatus, comprising:
at least one processor configured to:
establish a plurality of communication tunnels between a core wireless network component and a donor evolved Node B (eNB) related to a plurality of radio bearers between the donor eNB and a relay eNB;
associate each of the plurality of communication tunnels with at least one of a plurality of service data flows (SDF);
obtain a packet from an upstream gateway comprising a plurality of protocol headers;
determine an SDF for the packet based at least in part on processing one or more parameters in at least one of the plurality of protocol headers in conjunction with an SDF filter;
select one of the plurality of communication tunnels to transmit the packet based at least in part on the one or more parameters in the at least one of the plurality of protocol headers, wherein the at least one processor selects the one of the plurality of communication tunnels based at least in part on the determined SDF; and
transmit the packet over the one of the plurality of communication tunnels; and
a memory coupled to the at least one processor.

14. The apparatus of claim 13, wherein the one or more parameters of the at least one of the plurality of protocol headers is a differentiated services code point (DSCP) value.

15. The apparatus of claim 14, wherein the at least one processor is further configured to associate one or more ranges of DSCP values to at least a portion of the plurality of communication tunnels.

16. The apparatus of claim 13, wherein the SDF filter associates a plurality of SDF filter parameters with the plurality of communication tunnels, and the at least one processor processes the one or more parameters by associating the one or more parameters to a portion of the plurality of SDF filter parameters.

17. The apparatus of claim 13, wherein the at least one of the plurality of protocol headers is a general packet radio service (GPRS) tunneling protocol (GTP) header, and the one or more parameters of the at least one of the plurality of protocol headers is a downlink tunnel endpoint identifier.

18. The apparatus of claim 13, wherein the at least one of the plurality of protocol headers is an inner-most internet protocol (IP) header of the packet.

19. The apparatus of claim 13, wherein the one or more parameters of the at least one of the plurality of protocol headers is a user datagram protocol port number.

20. The apparatus of claim 13, wherein the at least one processor is further configured to:
obtain a disparate packet from the upstream gateway over a connection related to an internet protocol (IP) address; and
select a disparate tunnel from the plurality of communication tunnels for transmitting the disparate packet based at least in part on the IP address.

21. An apparatus, comprising:
means for initializing a plurality of communication tunnels between a core wireless network component and a donor evolved Node B (eNB) related to a plurality of radio bearers established between the donor eNB and a relay eNB, wherein each of the tunnels is associated with a service data flow (SDF);
means for receiving a packet related to a wireless device comprising a plurality of protocol headers; and
means for determining a tunnel from the plurality of communication tunnels for transmitting the packet to the donor eNB based at least in part on one or more parameters of at least one of the plurality of protocol headers, wherein the means for determining the tunnel from the plurality of communication tunnels includes determining an SDF for the packet according to an SDF filter based at least in part on the one or more parameters of the at least one of the plurality of protocol headers, and wherein the SDF corresponds to the tunnel.

22. The apparatus of claim 21, further comprising means for extracting a differentiated services code parameter (DSCP) value from the at least one of the plurality of protocol headers, wherein the one or more parameters of the at least one of the plurality of protocol headers is the DSCP value.

23. The apparatus of claim 21, further comprising means for determining a downlink tunnel endpoint identifier (DL-TEID) from the one or more parameters, wherein the means for determining the tunnel determines the SDF based at least in part on the DL-TEID, and the at least one of the plurality of protocol headers is a general packet radio service (GPRS) tunneling protocol (GTP) header.

24. The apparatus of claim 21, wherein the at least one of the plurality of protocol headers is an inner-most internet protocol (IP) header.

25. The apparatus of claim 21, further comprising means for determining a user datagram protocol (UDP) port number from the one or more parameters wherein the means for determining the tunnel determines the SDF based at least in part on the UDP port number.

26. The apparatus of claim 21, wherein the means for receiving receives the packet over a connection related to an internet protocol (IP) address and further receives a disparate packet over a disparate connection related to a disparate IP address, and the means for determining the tunnel determines the tunnel based at least in part on the IP address.

27. A computer program product, comprising:
a non-transitory computer-readable medium comprising:
code for causing at least one computer to establish a plurality of communication tunnels between a core wireless network component and a donor evolved Node B (eNB) related to a plurality of radio bearers between the donor eNB and a relay eNB;
code for causing the at least one computer to associate each of the plurality of communication tunnels with at least one of a plurality of service data flows (SDF);

code for causing the at least one computer to obtain a packet from an upstream gateway comprising a plurality of protocol headers;

code for causing the at least one computer to determine an SDF for the packet based at least in part on processing one or more parameters in at least one of the plurality of protocol headers in conjunction with an SDF filter; and code for causing the at least one computer to select one of the plurality of communication tunnels to transmit the packet based at least in part on the one or more parameters in the at least one of the plurality of protocol headers, wherein the code for causing the at least one computer to select one of the plurality of communication tunnels selects the one of the plurality of communication tunnels based at least in part on the determined SDF.

28. The computer program product of claim 27, wherein the one or more parameters of the at least one of the plurality of protocol headers is a differentiated services code point (DSCP) value.

29. The computer program product of claim 28, wherein the computer-readable medium further comprises code for causing the at least one computer to associate one or more ranges of DSCP values to at least a portion of the plurality of communication tunnels.

30. The computer program product of claim 27, wherein the SDF filter associates a plurality of SDF filter parameters with the plurality of communication tunnels, and the code for causing the at least one computer to determine the SDF processes the one or more parameters by associating the one or more parameters to a portion of the plurality of SDF filter parameters.

31. The computer program product of claim 27, wherein the at least one of the plurality of protocol headers is a general packet radio service (GPRS) tunneling protocol (GTP) header, and the one or more parameters of the at least one of the plurality of protocol headers is a downlink tunnel endpoint identifier.

32. The computer program product of claim 27, wherein the at least one of the plurality of protocol headers is an inner-most internet protocol (IP) header of the packet.

33. The computer program product of claim 27, wherein the one or more parameters of the at least one of the plurality of protocol headers is a user datagram protocol port number.

34. The computer program product of claim 27, wherein the computer-readable medium further comprises:

code for causing the at least one computer to obtain a disparate packet from the upstream gateway over a connection related to an internet protocol (IP) address; and code for causing the at least one computer to select a disparate tunnel from the plurality of communication tunnels for transmitting the disparate packet based at least in part on the IP address.

35. An apparatus, comprising:

a tunnel initializing component that establishes a plurality of communication tunnels between a core wireless network component and a donor evolved Node B (eNB) related to a plurality of radio bearers established between the donor eNB and a relay eNB, wherein each of the tunnels is associated with a service data flow (SDF);

a communicating component that receives a packet related to a wireless device comprising a plurality of protocol headers; and a tunnel associating component that determines a tunnel from the plurality of communication tunnels for transmitting the packet to the donor eNB based at least in part on one or more parameters of at least one of the plurality of protocol headers, wherein the tunnel associating component determines the tunnel from the plurality of communication tunnels by determining an SDF for the packet according to an SDF filtering component based at least in part on the one or more parameters of the at least one of the plurality of protocol headers, and wherein the SDF corresponds to the tunnel.

36. The apparatus of claim 35, further comprising an IP header parameter determining component that extracts a differentiated services code parameter (DSCP) value from the at least one of the plurality of protocol headers, wherein the one or more parameters of the at least one of the plurality of protocol headers is the DSCP value.

37. The apparatus of claim 35, wherein the SDF filtering component that determines a downlink tunnel endpoint identifier (DL-TEID) from the one or more parameters, wherein the tunnel associating component determines the SDF based at least in part on the DL-TEID, and the at least one of the plurality of protocol headers is a general packet radio service (GPRS) tunneling protocol (GTP) header.

38. The apparatus of claim 35, wherein the at least one of the plurality of protocol headers is an inner-most internet protocol (IP) header.

39. The apparatus of claim 35, further comprising a user datagram protocol (UDP) port determining component that extracts a UDP port number as the one or more parameters, wherein the tunnel associating component determines the SDF based at least in part on the UDP port number.

40. The apparatus of claim 35, wherein the communicating component receives the packet over a connection related to an internet protocol (IP) address and further receives a disparate packet over a disparate connection related to a disparate IP address, and the tunnel associating component determines the tunnel based at least in part on the IP address.

41. A method, comprising:

receiving one or more service data flow (SDF) filter parameters from a core wireless network component;

obtaining an uplink packet from a wireless device over one of a plurality of radio bearers associated therewith; and selecting one of a plurality of disparate radio bearers established with an upstream evolved Node B (eNB) for transmitting the uplink packet based at least in part on the one or more SDF filter parameters.

42. The method of claim 41, wherein the receiving the one or more SDF filter parameters includes receiving an n-tuple related to the wireless device, where n is a positive integer, and a tunnel utilized by the core wireless network component to transmit downlink packets comprising the n-tuple to the upstream eNB.

43. The method of claim 42, wherein the n-tuple is a 6-tuple comprising a downlink tunnel endpoint identifier related to the wireless device.

44. The method of claim 42, wherein the selecting the one of the plurality of disparate radio bearers includes selecting a radio bearer with the upstream eNB corresponding to the tunnel.

45. The method of claim 41, wherein the receiving the one or more SDF filter parameters includes receiving one or more parameters related to the wireless device and a user datagram protocol (UDP) port number for transmitting the uplink packet to the upstream eNB.

46. The method of claim 45, wherein the selecting the one of the plurality of disparate radio bearers includes inserting the UDP port number in a header for the uplink packet.

47. A wireless communications apparatus, comprising:
  at least one processor configured to:
    obtain one or more service data flow (SDF) filter parameters from an upstream network component;
    receive an uplink packet from a wireless device over a radio bearer established with the wireless device; and
    determine a disparate radio bearer established with an upstream evolved Node B (eNB) for transmitting the uplink packet based at least in part on the one or more SDF filter parameters; and
  a memory coupled to the at least one processor.

48. The wireless communications apparatus of claim 47, wherein the one or more SDF filter parameters includes an n-tuple related to the wireless device, where n is a positive integer, as well as one or more header parameters related to a tunnel utilized by the upstream network component to transmit downlink packets comprising the n-tuple to the upstream eNB, and the at least one processor determines the disparate radio bearer based at least in part on the one or more header parameters.

49. The wireless communications apparatus of claim 48, wherein the n-tuple is a 6-tuple comprising a downlink tunnel endpoint identifier related to the wireless device.

50. The wireless communications apparatus of claim 47, wherein the one or more SDF filter parameters include one or more parameters related to the wireless device and a user datagram protocol (UDP) port number for transmitting the uplink packet to the upstream eNB.

51. The wireless communications apparatus of claim 50, wherein the at least one processor is further configured to transmit the uplink packet over the disparate radio bearer at least in part by specifying the UDP port number in a header of the uplink packet.

52. An apparatus, comprising:
  means for receiving one or more service data flow (SDF) filter parameters;
  means for receiving an uplink packet from a wireless device; and
  means for determining a radio bearer established with an upstream evolved Node B (eNB) for transmitting the uplink packet based at least in part on the one or more SDF filter parameters.

53. The apparatus of claim 52, wherein the means for determining the radio bearer determines the radio bearer based further at least in part on one or more parameters in a header of the uplink packet.

54. The apparatus of claim 52, wherein the one or more SDF filter parameters includes an n-tuple, where n is a positive integer, and one or more parameters related to a tunnel utilized by a network component for transmitting downlink packets to the upstream eNB.

55. The apparatus of claim 52, wherein the one or more SDF filter parameters includes a user datagram protocol port number for transmitting the uplink packet to the upstream eNB.

56. A computer program product, comprising:
  a non-transitory computer-readable medium comprising:
    code for causing at least one computer to obtain one or more service data flow (SDF) filter parameters from an upstream network component;
    code for causing the at least one computer to receive an uplink packet from a wireless device over a radio bearer established with the wireless device; and
    code for causing the at least one computer to determine a disparate radio bearer established with an upstream evolved Node B (eNB) for transmitting the uplink packet based at least in part on the one or more SDF filter parameters.

57. The computer program product of claim 56, wherein the one or more SDF filter parameters includes an n-tuple related to the wireless device, where n is a positive integer, as well as one or more header parameters related to a tunnel utilized by the upstream network component to transmit downlink packets comprising the n-tuple to the upstream eNB, and the code for causing the at least one computer to determine the disparate radio bearer determines the disparate radio bearer based at least in part on the one or more header parameters.

58. The computer program product of claim 57, wherein the n-tuple is a 6 tuple comprising a downlink tunnel endpoint identifier related to the wireless device.

59. The computer program product of claim 56, wherein the one or more SDF filter parameters include one or more parameters related to the wireless device and a user datagram protocol (UDP) port number for transmitting the uplink packet to the upstream eNB.

60. The computer program product of claim 59, wherein the computer-readable medium further comprises code for causing the at least one computer to transmit the uplink packet over the disparate radio bearer at least in part by specifying the UDP port number in a header of the uplink packet.

61. An apparatus, comprising:
  a service data flow (SDF) filter parameter receiving component that obtains one or more SDF filter parameters from a network component;
  a communicating component that receives an uplink packet from a wireless device; and
  an SDF filtering component that determines a radio bearer established with an upstream evolved Node B (eNB) for transmitting the uplink packet based at least in part on the one or more SDF filter parameters.

62. The apparatus of claim 61, wherein the SDF filtering component determines the radio bearer based further at least in part on one or more parameters in a header of the uplink packet.

63. The apparatus of claim 61, wherein the one or more SDF filter parameters includes an n-tuple, where n is a positive integer, and one or more parameters related to a tunnel utilized by the network component for transmitting downlink packets to the upstream eNB.

64. The apparatus of claim 61, wherein the one or more SDF filter parameters includes a user datagram protocol port number for transmitting the uplink packet to the upstream eNB.

* * * * *